(12) United States Patent
Radek

(10) Patent No.: US 8,419,547 B1
(45) Date of Patent: Apr. 16, 2013

(54) ITERATIVE XOR-MATRIX FORWARD ERROR CORRECTION FOR GAMING

(75) Inventor: Paul J. Radek, Naperville, IL (US)

(73) Assignee: WMS Gaming, Inc., Waukegan, IL (US)

( * ) Notice: Subject to any disclaimer, the term of this patent is extended or adjusted under 35 U.S.C. 154(b) by 210 days.

(21) Appl. No.: 12/939,829

(22) Filed: Nov. 4, 2010

(51) Int. Cl.
*A63F 9/24* (2006.01)
*A63F 13/00* (2006.01)
*G06F 17/00* (2006.01)
*G06F 19/00* (2011.01)

(52) U.S. Cl.
USPC ........ 463/42; 375/240.28; 375/222; 370/389; 463/25; 463/40; 714/791; 714/776; 714/751

(58) Field of Classification Search .................. None
See application file for complete search history.

(56) References Cited

U.S. PATENT DOCUMENTS

| | | | |
|---|---|---|---|
| 6,876,705 B2 * | 4/2005 | Katsavounidis et al. | 375/240.28 |
| 7,162,684 B2 | 1/2007 | Hocevar | |
| 7,376,881 B2 * | 5/2008 | Xu et al. ................ | 714/751 |
| 7,472,334 B1 | 12/2008 | Scott et al. | |
| 7,487,425 B1 | 2/2009 | Chen | |
| 7,698,621 B2 | 4/2010 | Choi et al. | |
| 7,734,946 B2 | 6/2010 | Kobayashi | |
| 7,801,181 B2 | 9/2010 | Song et al. | |
| 7,822,134 B2 | 10/2010 | Kim et al. | |
| 2005/0141603 A1 * | 6/2005 | Miller ................... | 375/222 |
| 2005/0149824 A1 | 7/2005 | Arnez et al. | |
| 2005/0190762 A1 * | 9/2005 | Kobayashi ............. | 370/389 |
| 2006/0052156 A1 * | 3/2006 | Yates et al. ............ | 463/25 |

(Continued)

FOREIGN PATENT DOCUMENTS

| | | |
|---|---|---|
| WO | WO2008066421 | 6/2008 |
| WO | WO2008070342 | 6/2008 |

OTHER PUBLICATIONS

"Forward error correction", *Wikipedia* http://en.wikipedia.org/wiki/Forward_error_correction (Date Obtained from the Internet: Sep. 20, 2010) Last Date Modified: Jul. 30, 2010, 6 pages.

(Continued)

*Primary Examiner* — Paul A D'Agostino
(74) *Attorney, Agent, or Firm* — DeLizio Gilliam, PLLC

(57) ABSTRACT

A wagering game system and its operations are described herein. In some embodiments, the operations can include receiving a packet of gaming data. The packet includes data units and exclusive-OR check bytes. The data units and exclusive-OR check bytes are organized in the packet to correspond to vectors (e.g., columns and rows) of a matrix. Each of the exclusive-OR check bytes represent a result of a logical exclusive disjunction operation on a sequence of the data units contained in each of the vectors. The operations can further include detecting that some of the data units have data corruption and selecting one of the exclusive-OR check bytes that corresponds to one of the vectors. The one of the vectors includes only one corrupted data unit. The operations can further include recovering the one corrupted data unit using the one of the exclusive-OR check bytes that corresponds to the one of the vectors. In some embodiments, the operations further include repeatedly selecting groups of the vectors that have only one corrupted data unit and recovering the one corrupted data units from the groups of the vectors.

37 Claims, 12 Drawing Sheets

U.S. PATENT DOCUMENTS

| | | |
|---|---|---|
| 2007/0121639 A1* | 5/2007 | Degrande et al. ............. 370/394 |
| 2007/0157069 A1* | 7/2007 | Lyakh et al. ................. 714/791 |
| 2007/0260966 A1 | 11/2007 | Kim et al. |
| 2008/0028279 A1* | 1/2008 | Ver Steeg ...................... 714/776 |
| 2008/0229176 A1 | 9/2008 | Arnez et al. |
| 2009/0164864 A1 | 6/2009 | Matsumoto et al. |
| 2010/0146357 A1 | 6/2010 | Larsson |
| 2010/0257432 A1 | 10/2010 | Resnick |
| 2011/0158173 A1* | 6/2011 | Cucala Garcia et al. ..... 370/328 |
| 2011/0219279 A1* | 9/2011 | Abu-Surra et al. ........... 714/746 |
| 2012/0011413 A1* | 1/2012 | Liu et al. ...................... 714/746 |

OTHER PUBLICATIONS

"Low-density parity-check code", *Wikipedia* http://en.wikipedia.org/wiki/Low-density_parity-check_codes (Date Obtained from the Internet: Sep. 20, 2010) Last Date Modified: Aug. 19, 2010, 7 pages.

Wang, Charles et al., "Forward Error-Correction Coding", *Crosslink* http://www.aero.org/publications/crosslink/winter2002/04.html (Date Obtained from the Internet: Sep. 20, 2010) Last Date Modified: May 14, 2007, 4 pages.

\* cited by examiner

| | SYMBOL | MEANING |
|---|---|---|
| 511 | + | ERROR |
| 612 | O | CORRECTED ERROR VIA XOR RECOVERY |
| 613 | ⬚ | TALLY CHECK |

ITERATIVE XOR-MATRIX FORWARD ERROR CORRECTION FOR GAMING

LIMITED COPYRIGHT WAIVER

A portion of the disclosure of this patent document contains material that is subject to copyright protection. The copyright owner has no objection to the facsimile reproduction by anyone of the patent disclosure, as it appears in the Patent and Trademark Office patent files or records, but otherwise reserves all copyright rights whatsoever. Copyright 2010, WMS Gaming, Inc.

TECHNICAL FIELD

Embodiments of the inventive subject matter relate generally to wagering game systems and networks that, more particularly, perform error detection and correction for gaming data.

BACKGROUND

Wagering game machines, such as slot machines, video poker machines and the like, have been a cornerstone of the gaming industry for several years. Generally, the popularity of such machines depends on the likelihood (or perceived likelihood) of winning money at the machine and the intrinsic entertainment value of the machine relative to other available gaming options. Where the available gaming options include a number of competing wagering game machines and the expectation of winning at each machine is roughly the same (or believed to be the same), players are likely to be attracted to the most entertaining and exciting machines. Shrewd operators consequently strive to employ the most entertaining and exciting machines, features, and enhancements available because such machines attract frequent play and hence increase profitability to the operator. Therefore, wagering game machine manufacturers strive to continuously develop new games and gaming enhancements that will attract frequent play. However, wagering game manufacturers are also aware that any distraction or malfunction in a wagering game can distract a player and negatively affect the player's level of entertainment. Wagering game manufacturers therefore strive to build into their gaming products fail-safes and procedures to ensure that their gaming products work correctly. One such procedure involves transmitting data using some form of error detection and correction for data transmitted across a gaming network. The general idea for achieving error detection and correction is to add some redundancy (i.e., some extra data) to a message, which receivers can use to check consistency of the delivered message, and to recover data determined to be erroneous. For example, according to some current gaming procedures and protocols, a sending device transmits a packet with cyclic redundancy check (CRC) code combined with parity checks to detect corruption of the contents of the packet. A receiving device receives and examines the packet to determine whether the packet is good, and passed on for consumption, or is corrupted and discarded. When a packet is discarded, the receiving device notifies the sending device of the failed packet and requests the packet be sent again. However, there is no guarantee that the packet will be delivered again successfully. Further, resending data leads to greatly increased data packet bandwidth compromising a real-time delivery of event data.

BRIEF DESCRIPTION OF THE DRAWING(S)

Embodiments are illustrated in the Figures of the accompanying drawings in which.

DESCRIPTION OF ILLUSTRATIVE EMBODIMENTS

Figure 1:
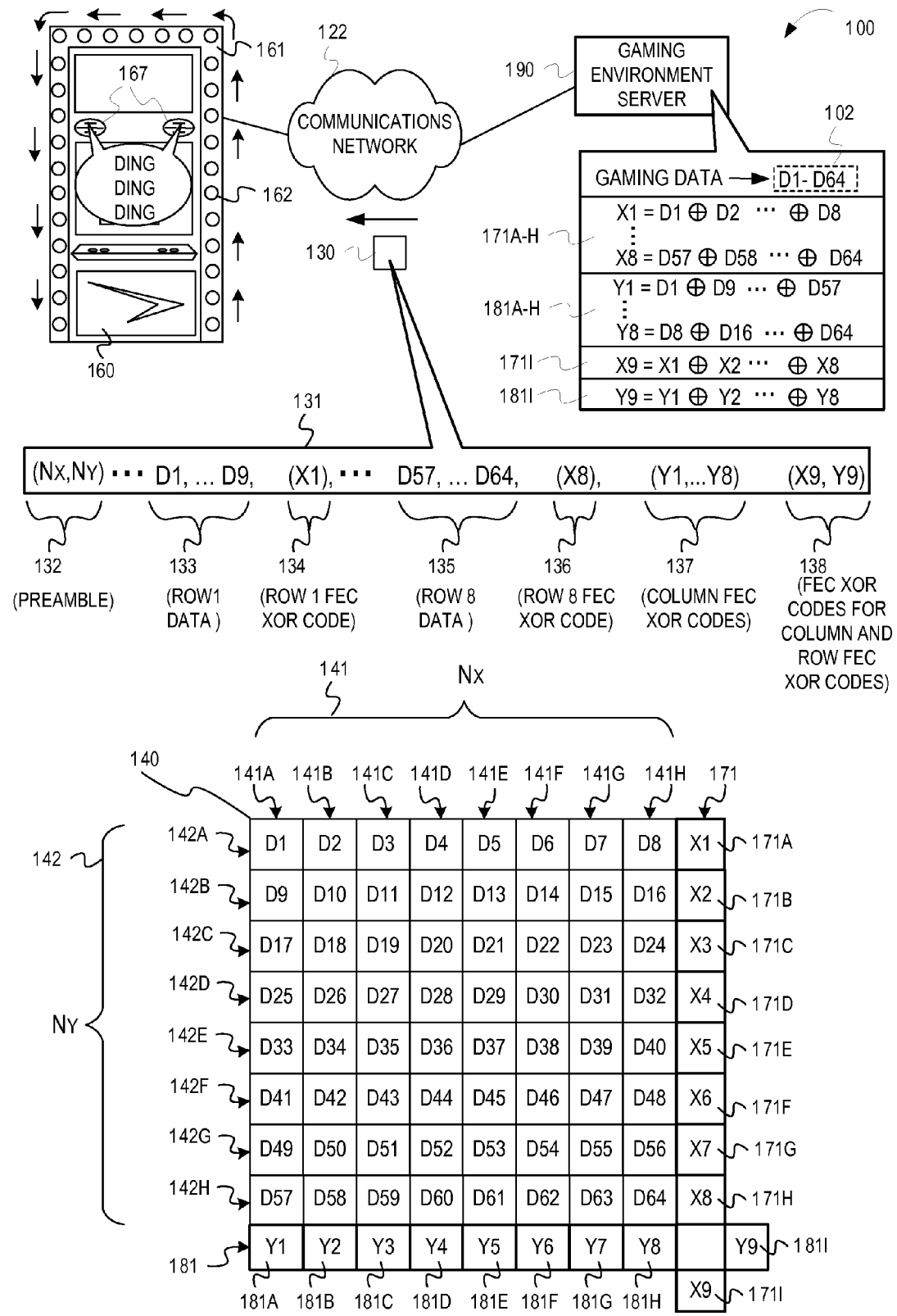
FIG. 1 is an illustration of transmitting gaming data in a transmission packet having exclusive-OR (XOR) forward error correction (FEC) codes organized according to a two-dimensional XOR matrix, according to some embodiments.

This description of the embodiments is divided into six sections. The first section provides an introduction to embodiments. The second section describes example operating environments while the third section describes example operations performed by some embodiments. The fourth section describes additional example embodiments while the fifth section describes additional example operating environments. The sixth section presents some general comments.

Introduction

This section provides an introduction to some embodiments.

Wagering game manufacturers have begun to integrate environmental lighting and emotive lighting with wagering games, to generate light and sound shows or other multi-media effects that are external to a game. The light and sound shows are often integrated with (e.g., triggered by, synchronized with, etc.) gaming events. The external multi-media effects integrated with wagering games may be referred to herein as integrated gaming effects, external gaming effects, environmental gaming effects, emotive lighting effects, etc. For brevity, herein all such effects may also be referred to as gaming effects. The gaming effects are tightly synchronized with gaming events so that they are presented synchronously, in real-time. Consequently, the transmission of gaming effects data requires a high quality level of data transmission, for example, to ensure a bank of wagering game machines has a coordinated lightshow that is responsive to game play and appealing to the casual observer. Error detection and correction methods are necessary to ensure real-time data delivery and synchronization of gaming events and gaming effects.

One particular way of performing error correction of a data, or transmission, packet ("packet"), not conventionally used for gaming, is forward error correction (FEC). Through FEC a sender encodes data using an error-correcting code (ECC), also known as a forward error correction code (FECC), prior to transmission. FEC encoding assumes that some of the packet may become corrupted during transmission and provides error correcting codes within the packet to aid in the reconstruction of the packet. The error correcting codes are used by a receiver to recover the original data. The FEC encoded data packet size transmitted is larger than the original packet, but on degraded transmission lines will actually consume less bandwidth due to eliminating most resends, greatly improving the delivery time of packets.

Many types of FEC encoding algorithms exist. However, most published correction codes require dedicated encoding and decoding hardware to process the packets in a real-time manner due to the complexity of the math models involved.

Some embodiments of the inventive subject matter present an easy to use and efficient FEC encoding solution. According to some embodiments, the encoding solution described uses a multi-dimensional (e.g. two-dimensional or three-dimensional) XOR matrix code to provide lightweight FEC codes that are easy to encode and decode and can provide error recovery of real-time gaming data even for noisy transmission lines and signals.

FIG. 1 is a conceptual diagram that illustrates an example of transmitting gaming data in a transmission packet having exclusive-OR (XOR) forward error correction (FEC) codes organized according to a two-dimensional XOR matrix, according to some embodiments. In FIG. 1, a wagering game system ("system") 100 includes a gaming environment server 190 connected to a wagering game machine 160 via a communications network 122. The wagering game machine 160 includes a lighting device 161 with light sources (e.g., light emitting diodes, or LEDs 162) affixed to the lighting device 161. The wagering game machine 160 may also include speakers 167. In some embodiments, the lighting device 161 may be attached to and controlled by one or more components of the wagering game machine 160. In some embodiments, the lighting device 161 and/or the speakers 167 may be attached and/or associated with the wagering game machine 160, but controlled by an external effects controller, such as the gaming environment server 190, some intermediary controller (e.g., a network wagering game application, a wagering game machine bank controller), some combination, etc. The gaming environment server 190 provides gaming effects data in a packet 130. The packet 130 can include data related to external gaming effects (e.g., coordinated light shows, sounds external to a wagering game, etc.) that may be based on, or triggered by a gaming event, and which runs synchronously across a bank of wagering game machines, via a series of overhead spotlights, across a train of emotive lighting panels, etc. The external gaming effects may also run synchronously with gaming effects produced by gaming software, to identify a wagering game machine that received a certain result (e.g., a big win, a jackpot, etc.). For instance, the wagering game machine 160 may have experienced a jackpot win during play of a wagering game. The wagering game machine 160, or an application integrated or associated with the wagering game machine 160 (e.g., an application on a progressive game server), may send a signal to the gaming environment server 190 informing the gaming environment server 190 of the jackpot win. The gaming environment server 190 may then select a specific lighting show and broadcast a stream of data for the specific lighting show that will highlight the wagering game machine 160 (e.g., cause the lighting device 161 to run a pattern of light effects, cause the speakers 167 to make a repeated ringing sound, cause an overhead spotlight to shine on the wagering game machine 160, etc.). The timing of the light show is important to match with timing for any other presentations on the wagering game machine 160, or elsewhere, related to the same gaming event (i.e., the jackpot win). If the timing of the lighting show data is interrupted because of data corruption to the packet 130, then synchronization of the presentation of the lighting show will be off from other gaming effects for the gaming event. As a result, the lighting presentation may disappoint or even confuse the player at the wagering game machine 160 and other players at the casino. Thus, it is very important for the gaming environment server 190 to provide data in a way that can be quickly and reliably recovered, such as via forward error correction. Further, because the communications network 122 may be under heavy use during busy periods at a casino, and because busy times at a casino provide the greatest opportunity to impress players and increase potential gambling, correct and reliable presentation of the synchronized gaming effects are critical to a casino's profitability.

The system 100, therefore, structures the packet 130 using a two-dimensional (2D) matrix ("matrix") 140 and recovers corrupted data via the same matrix 140. For instance, the gaming environment server 190 breaks up the gaming effects data into multiple parts or data units 102 (e.g., data units D1-D64). The gaming environment server 190 further performs XOR operations on the data units 102, which generates a first group of XOR outcomes 171A-H. An XOR operation is also known as a logical exclusive disjunction operation on a number of operands that results in an outcome value. For instance, in the equation "a=b^c," where the "^" symbol represents an XOR operation, "b" and "c" are operands and "a" is an XOR outcome. The XOR outcome, in many examples described below, will be referred to as an XOR check byte. Thus, in FIG. 1, the first group of XOR outcomes 171A-H will be referred to as the first group of XOR check bytes 171A-H. The gaming environment server 190 performs XOR operations on the first group of XOR of check bytes 171A-H, which generates a first additional XOR check byte 171I. The gaming environment server 190 further performs XOR operations on the data units 102, which generates a second group of XOR check bytes 181A-H. The gaming environment server 190 then performs XOR operations on the second group of XOR check bytes 181A-H, which generates a second additional XOR check byte 181I. The gaming environment server 190 then generates FEC codes (e.g., FEC codes 134, 136, 137, and 138) using the first group of XOR check bytes 171A-H, the second group of XOR check bytes 181A-H, the first additional XOR check byte 171I and the second additional XOR check byte 181I. The gaming environment server 190 then organizes the FEC codes (e.g., FEC codes 134, 136, 137, and 138) and the data units 102 into the packet 130 according to a specific packet structure 131. The gaming environment server 190 then sends the packet 130 to the wagering game machine 160 via the communications network 122.

The gaming environment server 190 can generate the first group of XOR check bytes 171A-H, the second group of XOR check bytes 181A-H, the first additional XOR check byte 171I and the second additional XOR check byte 181I by organizing the data units 102 into the matrix 140. The matrix 140 has structural groups, or vectors of values (e.g., rows and columns) organized in parallel patterns (e.g., rows are parallel with each other, columns are parallel with each other) and orthogonal patterns (e.g., rows are orthogonal to columns). Each vector has a subset of the data units 102 ordered in a sequence. The gaming environment server 190 can vary the size of the matrix 140 based on the conditions of the system 100 (e.g., based on an amount of signal noise on the network, degree of wagering activity, a time of day, a level of importance of the gaming data, a degree of required synchronization of presentation of the gaming data, etc.). FIG. 1 shows an 8×8 encoding matrix (e.g., 64 bytes), for example, with a number of rows "Ny" (e.g. "8" rows, 142A-H) for a first dimension 142 of the matrix 140 and a number of columns "Nx" (e.g., "8" columns, 141A-141H) for a second dimension 141 of the matrix 140. When the gaming environment server 190 arranges the data units 102 in the matrix 140, the gaming environment server 190 performs XOR operations of each of the data units 102 for each separate one of the rows 142A-H, resulting in the first group of XOR check bytes 171A-H. For example, a first row check byte 171A ("X1") is result of XOR-ing the data units D1-D8 of the row 142A (i.e., X1=D1^D2^D3^D4^D5^D6^D7^D8). The gaming environment server 190 further performs XOR operations of each of the data units 102 for each separate one of the columns 141A-H, resulting in the second group of XOR check bytes 181A-H. For example, a first column check byte 181A ("Y1") is result of XOR-ing the data units D1-D57 of the column 141A (e.g., Y1=D1^D9^D17^D25^D33^D41^D49^D57). The gaming environment server 190 further performs XOR operations of each of the first group of XOR check bytes 171A-H resulting in the first additional XOR check byte 171I. The gaming environment server 190 further performs XOR operations of each of the second group of XOR check bytes 181A-H resulting in the second additional XOR check byte 181I A. A property of XOR is that if "a=b^", then "b" or "c" can be reconstructed with "a." For example: "b=c^a" and "c=b^a." Therefore if one of the three elements is corrupted, it can be reconstructed from the other two. This works for longer sequences of values as well (e.g., "a=b^c^d^e^f," and so forth). As long as only one operand in the equation has been corrupted (e.g., element "d"), it can be recovered by XOR of the remaining elements (i.e., elements "b," "c," "e," and "f") with the XOR outcome (i.e., "a").

After the gaming environment server 190 generates the first group of XOR check bytes 171A-H and the second group of XOR check bytes 181A-H, the gaming environment server 190 generates FEC codes for each of the first group of XOR check bytes 171A-H and the second group of XOR check bytes 181A-H. The FEC codes include, or are somehow based on, the first group of XOR check bytes 171A-H and the second group of XOR check bytes 181A-H. The gaming environment server 190 then organizes the FEC codes (e.g., FEC codes 134, 136, 137, and 138) and the data units 102 into the packet 130 according to the packet structure 131. In one example of a packet structure 131, the gaming environment server 190 can include the dimensions (e.g., Nx and Ny) of the matrix 140 in a preamble 132, then package each row of data separately followed by an FEC code for the row until all rows are packaged (e.g., package data portion 133 for row 142A, followed by FEC code 134, followed by data portions and FEC codes for all rows through data portion 135 for row 142H followed by FEC code 136). The gaming environment server 190 can further package FEC codes 137 for the columns, and FEC codes 138 for the first additional XOR check byte 171I and the second additional XOR check byte 181I. One should note the package structure 131 is only one example. The gaming environment server 190 could in another example package column data followed by FEC codes for each column, and then subsequently package FEC codes for the rows.

The gaming environment server 190 then sends the packet 130 to the wagering game machine 160. When the wagering game machine 160 receives the packet 130, the wagering game machine 160 can flag any portion of the packet 130 that is damaged or corrupted using the matrix 140. The wagering game machine 160 can further tally errors per row and column in the matrix 140. The wagering game machine 160 can further determine which rows and columns can be used for data recovery. For example, the wagering game machine 160 can scan the columns for errors first, followed by the rows, or vice versa. The wagering game machine 160 can iteratively scan and repair rows and columns that have only one ("1") corrupted data unit until either all corrupted data units have been recovered (resulting in a good packet), or until corrupted data units can no longer be recovered (e.g., more than one of the rows and columns have multiple corrupted data units, but none of the rows and columns have only 1 corrupted data unit). FIGS. 4-10 illustrate an example of recovering errors using the matrix 140.

Further, some embodiments of the inventive subject matter may describe examples of performing forward error correction for gaming data in a network wagering venue (e.g., an online casino, a wagering game website, a wagering network, etc.) using a communication network, such as the communications network 122 in FIG. 1. Embodiments can be presented over any type of communications network that provides access to wagering games, such as a public network (e.g., a public wide-area-network, such as the Internet), a private network (e.g., a private local-area-network gaming network), a file sharing network, a social network, etc., or any combination of networks. Multiple users can be connected to the networks via computing devices. The multiple users can have accounts that subscribe to specific services, such as account-based wagering systems (e.g., account-based wagering game websites, account-based casino networks, etc.).

Further, in some embodiments herein a user may be referred to as a player (i.e., of wagering games), and a player may be referred to interchangeably as a player account. Account-based wagering systems utilize player accounts when transacting and performing activities, at the computer level, that are initiated by players. Therefore, a "player account" represents the player at a computerized level. The player account can perform actions via computerized instructions. For example, in some embodiments, a player account may be referred to as performing an action, controlling an item, communicating information, etc. Although a player, or person, may be activating a game control or device to perform the action, control the item, communicate the information, etc., the player account, at the computer level, can be associated with the player, and therefore any actions associated with the player can also be associated with the player account. Therefore, for brevity, to avoid having to describe the interconnection between player and player account in every instance, a "player account" may be referred to herein in either context. Further, in some embodiments herein, the word "gaming" is used interchangeably with "gambling."

Although FIG. 1 describes some embodiments, the following sections describe many other features and embodiments.

Example Operating Environments

This section describes example operating environments and networks and presents structural aspects of some embodiments. More specifically, this section includes discussion about wagering game system architectures.

Wagering Game System Architecture

Figure 2:
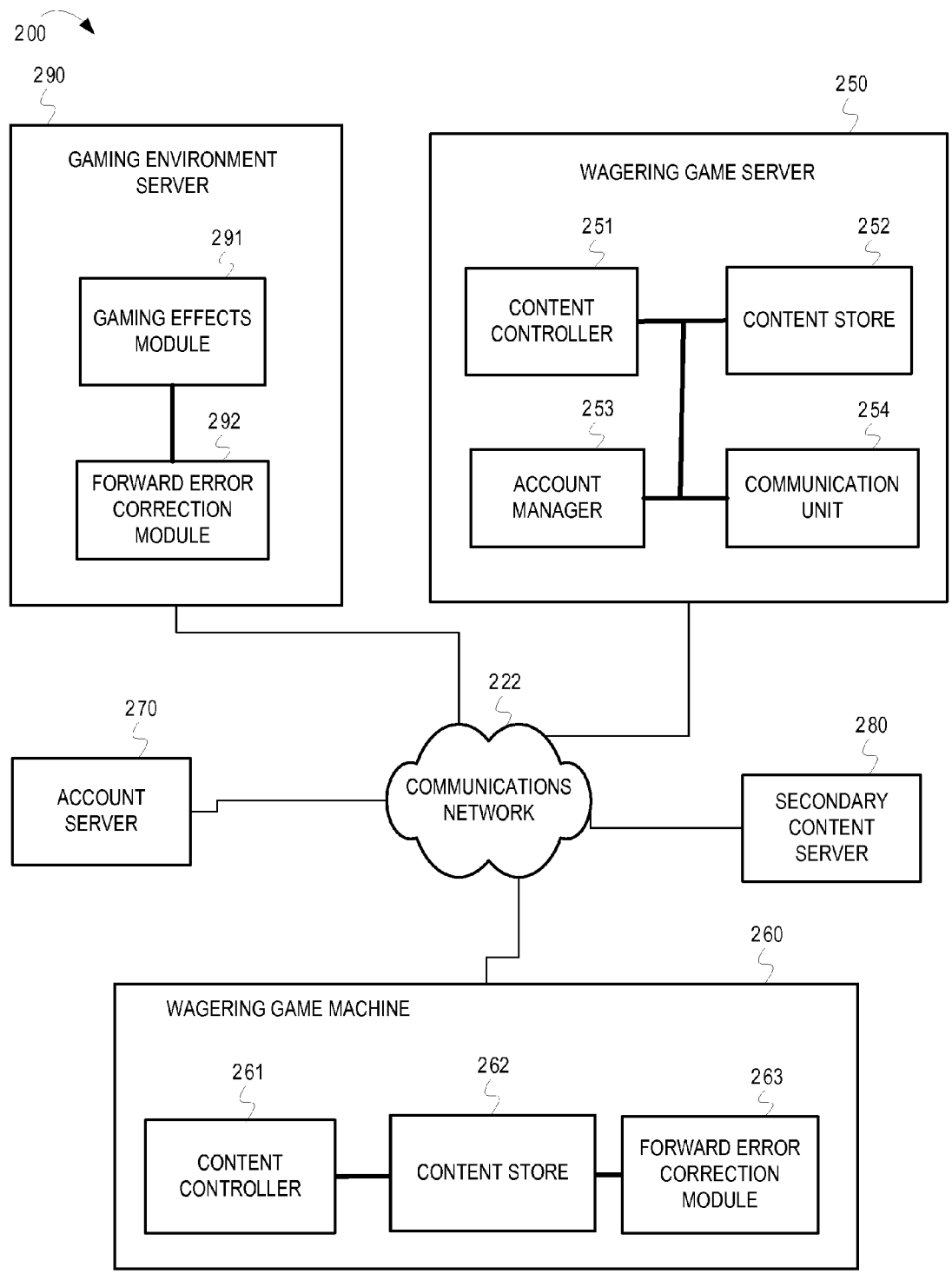
FIG. 2 is an illustration of a wagering game system architecture 200, according to some embodiments.

FIG. 2 is a conceptual diagram that illustrates an example of a wagering game system architecture 200, according to some embodiments. The wagering game system architecture 200 can include an account server 270 configured to control user related accounts accessible via wagering game networks and social networking networks. The account server 270 can store wagering game player account information, such as account settings (e.g., settings related to group games, settings related to social contacts, etc.), preferences (e.g., player preferences regarding sound volume, player preferences regarding types of lighting presentations, player preferences regarding types of wagering games, etc.), player profile data (e.g., name, avatar, screen name, etc.), and other information for a player's account (e.g., financial information, account identification numbers, virtual assets, social contact information, etc.). The account server 270 can contain lists of social contacts referenced by a player account. The account server 270 can also provide auditing capabilities, according to regulatory rules. The account server 270 can also track performance of players, machines, and servers.

The wagering game system architecture 200 can also include a wagering game server 250 configured to control wagering game content, provide random numbers, and communicate wagering game information, account information, and other information to and from the wagering game machine 260. The wagering game server 250 can include a content controller 251 configured to manage and control content for the presentation of content on the wagering game machine 260. For example, the content controller 251 can generate game results (e.g., win/loss values), including win amounts, for games played on the wagering game machine 260. The content controller 251 can communicate the game results to the wagering game machine 260. The content controller 251 can also generate random numbers and provide them to the wagering game machine 260 so that the wagering game machine 260 can generate game results. The wagering game server 250 can also include a content store 252 configured to contain content to present on the wagering game machine 260. The wagering game server 250 can also include an account manager 253 configured to control information related to player accounts. For example, the account manager 253 can communicate wager amounts, game results amounts (e.g., win amounts), bonus game amounts, etc., to the account server 270. The wagering game server 250 can also include a communication unit 254 configured to communicate information to the wagering game machine 260 and to communicate with other systems, devices and networks.

The wagering game system architecture 200 can also include a wagering game machine 260 configured to present wagering games. The wagering game machine 260 can include a content controller 261 configured to manage and control content and presentation of content on the wagering game machine 260. The wagering game machine 260 can also include a content store 262 configured to contain content to present on the wagering game machine 260. The wagering game machine 260 can also include a forward error correction module 263 configured to receive and decode transmission packets that contain forward error correction codes and gaming data organized according to an XOR matrix.

The wagering game system architecture 200 can also include a gaming environment server 290 configured to present environmental light and sound effects in a casino environment. The gaming environment server 290 can include a gaming effects module 291 configured to provide content data, user data, and control information regarding gaming effects within a casino environment. For example, the gaming effects module 291 can coordinate a synchronized presentation of lighting and sound effects across a bank of wagering game machines and/or other lighting and sound producing devices within one or more areas of a casino. The gaming effects module 291 can also be configured to detect gaming events, such as events generated by the wagering game server 250 and/or the wagering game machine 260. The gaming effects module 291 can generate data for a synchronized light/sound show based on the gaming events. The gaming effects module 291 can control environmental light presentation devices within a casino. The gaming effects module 291 can provide emotive lighting presentation data, including light presentation commands on emotive lighting devices on or near wagering game machines, as well as other devices within the casino such as spotlights, overhead emotive lighting, projectors, etc. The gaming effects module 291 can be configured to determine multi-media, casino-content, including casino-wide special effects that include sound effects and light effects. The multi-media casino content can be presentable across a plurality of casino content presentation devices ("presentation devices") in a casino. The multi-media, casino-content effect can be related to a wagering game presentation or event. The wagering game presentation or event can be tied to the functionality, activity, or purpose of a wagering game. For instance, wagering game presentations can be related to attracting wagering game players to groups of wagering game machines, presenting game related outcomes across multiple wagering game machines, expressing group gaming activity across multiple wagering game machines, focusing attention on a particular person or machine in response to a gaming event, etc. The presentation devices present sound and light effects that accompany a gaming event (e.g., a jackpot celebratory effect that focuses on a wagering game machine, a lightning strike that introduces a community gaming event, and a musical chair game that reveals a community wagering game winner). The gaming effects module 291 can also be configured to determine timing control data for the multi-media effect. In some embodiments, timing control data can be stored on the gaming environment server 290, or be accessible to the gaming effects module 291 via another device (e.g., a lighting controller associated with a bank of wagering game machines), to use to send lighting commands in sequential order to network addresses of presentation device on a casino network. The gaming effects module 291 can determine channels assigned with casino-content presentation devices, such as the wagering game machine 260. In some embodiments, the presentation devices can have an addresses assigned to a channel. For example, the wagering game machine 260 could be on one channel, peripheral devices could be on another channel, network light presentation devices can be on other channels, etc. In some embodiments, the gaming effects module 291 can be a DMX controller connected in parallel to an emotive lighting controller on, or associated with, the wagering game machine 160. The DMX controller can also be connected in parallel to a plurality of other presentation devices (e.g., other wagering game machines, lighting presentation devices, etc.) within a casino, and can simultaneously provide DMX lighting commands to the wagering game machine 260 and to the other presentation devices. DMX can change light intensity, or other light characteristics, over time. Some embodiments of DMX controllers can update commands very quickly (e.g., 30-47 times a second) across multiple channels (e.g., 512 channels). A DMX controller can put different commands in every channel (e.g., one channel can have show "X," one channel can have show "Y," etc.). The DMX can also have a frame number within a show. Some devices can take up more than one channel (e.g., an emotive light might have three colors and may take up a channel for each color, a spotlight might have seven channels, etc.). Each device can receive 512 bytes of data from the DMX controller at any given time interval (e.g., frame). The 512 bytes of data can be divided in different ways. For example, 6 bytes may address light effect behavior, 6 bytes may include show numbers, 6 bytes may include frame numbers, 1 byte may include priority values, and so on for various light effect characteristics (e.g., intensity, color, pan, tilt, etc.). The presentation device that receives the DMX command data is programmed to interpret the lighting data in the channel. In some embodiments, the presentation devices can be DMX compliant including having a DMX input port to accept DMX commands. In some embodiments, presentation devices can convert the DMX commands to proprietary commands. In addition to the DMX protocol, other types of dedicated lighting protocols can include AMX 192, CMX, SMX, PMX, protocols included in the EIA-485 standard, etc. The gaming environment server 290 can also include a forward error correction module 292 configured to generate and encode transmission packets with forward error correction codes and gaming data organized according to an XOR matrix.

The wagering game system architecture 200 can also include a secondary content server 280 configured to provide content and control information for secondary games and other secondary content available on a wagering game network (e.g., secondary wagering game content, promotions content, advertising content, player tracking content, web content, etc.). The secondary content server 280 can provide "secondary" content, or content for "secondary" games presented on the wagering game machine 260. "Secondary" in some embodiments can refer to an application's importance or priority of the data. In some embodiments, "secondary" can refer to a distinction, or separation, from a primary application (e.g., separate application files, separate content, separate states, separate functions, separate processes, separate programming sources, separate processor threads, separate data, separate control, separate domains, etc.). Nevertheless, in some embodiments, secondary content and control can be passed between applications (e.g., via application protocol interfaces), thus becoming, or falling under the control of, primary content or primary applications, and vice versa. The secondary content server 280 can include one or more different servers or devices including a secondary game server (e.g., a bonus game server, etc.), a network game server (e.g., a progressive game server, a big event server), an advertising server, a community game server, etc. The secondary content server 280 can provide and control content for community games, including networked games, social games, competitive games, or any other game that multiple players can participate in at the same time.

Each component shown in the wagering game system architecture 200 is shown as a separate and distinct element connected via a communications network 222. However, some functions performed by one component could be performed by other components. For example, the wagering game server 250 can also be configured to perform functions of the gaming effects module 291, the forward error correction module 292, and other network elements and/or system devices. Furthermore, the components shown may all be contained in one device, but some, or all, may be included in, or performed by, multiple devices, as in the configurations shown in FIG. 2 or other configurations not shown. For example, the account manager 253 and the communication unit 254 can be included in the wagering game machine 260 instead of, or in addition to, being a part of the wagering game server 250. Further, in some embodiments, the wagering game machine 260 can determine wagering game outcomes, generate random numbers, etc. instead of, or in addition to, the wagering game server 250.

The wagering game machines described herein (e.g., wagering game machine 260) can take any suitable form, such as floor standing models, handheld mobile units, bar-top models, workstation-type console models, surface computing machines, etc. Further, wagering game machines can be primarily dedicated for use in conducting wagering games, or can include non-dedicated devices, such as mobile phones, personal digital assistants, personal computers, etc.

In some embodiments, wagering game machines and wagering game servers work together such that wagering game machines can be operated as thin, thick, or intermediate clients. For example, one or more elements of game play may be controlled by the wagering game machines (client) or the wagering game servers (server). Game play elements can include executable game code, lookup tables, configuration files, game outcome, audio or visual representations of the game, game assets or the like. In a thin-client example, the wagering game server can perform functions such as determining game outcome or managing assets, while the wagering game machines can present a graphical representation of such outcome or asset modification to the user (e.g., player). In a thick-client example, the wagering game machines can determine game outcomes and communicate the outcomes to the wagering game server for recording or managing a player's account.

In some embodiments, either the wagering game machines (client) or the wagering game server(s) can provide functionality that is not directly related to game play. For example, account transactions and account rules may be managed centrally (e.g., by the wagering game server(s)) or locally (e.g., by the wagering game machines). Other functionality not directly related to game play may include power management, presentation of advertising, software or firmware updates, system quality or security checks, etc.

Furthermore, the wagering game system architecture 200 can be implemented as software, hardware, any combination thereof, or other forms of embodiments not listed. For example, any of the network components (e.g., the wagering game machines, servers, etc.) can include hardware and machine-readable storage media including instructions for performing the operations described herein.

Example Operations

This section describes operations associated with some embodiments. In the discussion below, some flow diagrams are described with reference to block diagrams presented herein. However, in some embodiments, the operations can be performed by logic not described in the block diagrams.

In certain embodiments, the operations can be performed by executing instructions residing on machine-readable storage media (e.g., software), while in other embodiments, the operations can be performed by hardware and/or other logic (e.g., firmware). In some embodiments, the operations can be performed in series, while in other embodiments one or more of the operations can be performed in parallel. Moreover, some embodiments can perform more or less than all the operations shown in any flow diagram.

Figure 3:
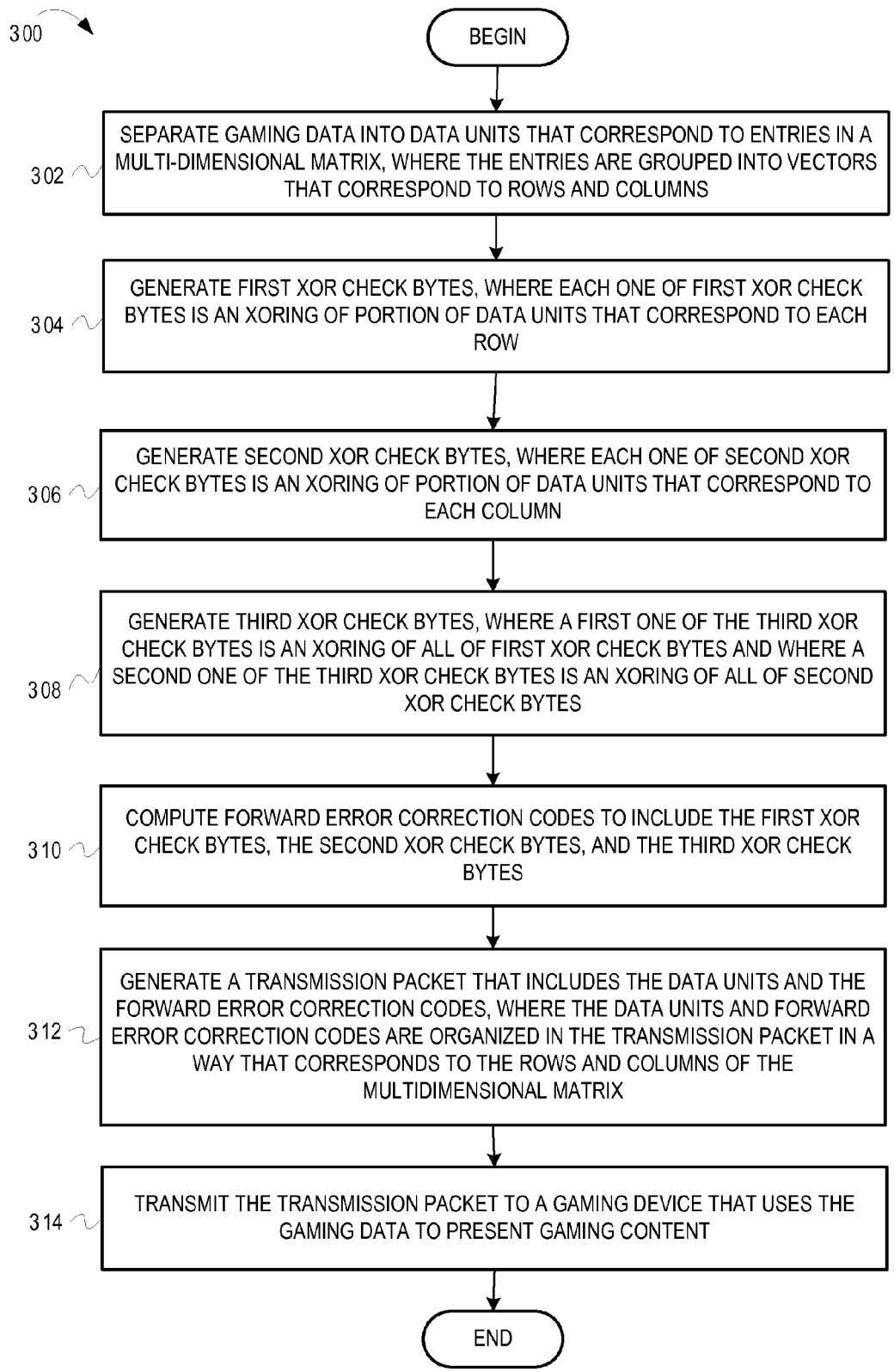
FIG. 3 is a flow diagram 300 illustrating generating and transmitting gaming data in a transmission packet having XOR FEC codes organized according to an XOR matrix, according to some embodiments.

FIG. 3 is a flow diagram ("flow") 300 illustrating generating and transmitting gaming data in a transmission packet having exclusive-OR (XOR) forward error correction (FEC) codes organized according to an XOR matrix, according to some embodiments. This description will refer occasionally to FIG. 1 while presenting FIG. 3. In FIG. 3, the flow 300 begins at processing block 302, where a wagering game system ("system") separates gaming data into data units that correspond to entries in a multi-dimensional matrix ("matrix"), where the entries are grouped into vectors that correspond to rows and columns of the matrix. The matrix entries may also be referred to as elements or cells. The vectors may be referred to specifically as columns or rows. For a two-dimensional matrix, each of the rows are parallel to each other, each of the columns are parallel to each other, and the columns are orthogonal (i.e., perpendicular) to the rows. In some embodiments, the vectors may also be arranged diagonally, or in other configurations of grouped data units within the matrix. FIG. 1 above described one example of separating gaming data into sixty-four (64) data units 120 (D1-D64). The data units can be bytes of data. In some embodiments, the system can generate packets according to different sized matrices (e.g., multiple network devices may have different noise). In some embodiments, the system can also partition the packet into smaller units with an upper limit on the matrix size. If the packet is larger than the largest matrix size supported, then the system partitions the packet into smaller units acceptable for encoding and later, on the decoding side, reassembles the smaller packets into a large packet.

Returning to FIG. 3, the flow 300 continues at processing block 304, where the system generates first XOR check bytes, where each one of first XOR check bytes is an XOR-ing of portion of data units that correspond to each row. For instance, in FIG. 1 above, the system 100 generated the first group of XOR check bytes 171A-H that corresponded to a number of the data units 102 in each of the rows 142A-H. XOR-ing involves performing a logical exclusive disjunction operation.

The flow 300 continues at processing block 306, where the system generates second XOR check bytes, where each one of second XOR check bytes is an XOR-ing of portion of data units that correspond to each column. For instance, in FIG. 1 above, the system 100 generated the second group of XOR check bytes 181A-H that corresponded to a number of the data units 102 in each of the columns 141A-H.

The flow 300 continues at processing block 308, where the system generates third XOR check bytes, where a first one of the third XOR check bytes is an XOR-ing of all of first XOR check bytes and where a second one of the third XOR check bytes is an XOR-ing of all of second XOR check bytes. For instance, in FIG. 1 above, the system 100 generated the first additional XOR check byte 171I ("X9"), which was the XOR-ing of the first group of XOR check bytes 171A-H (i.e., X9=X1^X2^X3^X4^X5^X6^X7^X8). The system 100 also generated the second additional XOR check byte 181I ("Y9"), which was the XOR-ing of the second group of XOR check bytes 181A-H (i.e., Y9=Y1^Y2^Y3^Y4^Y5^Y6^Y7^Y8).

The flow 300 continues at processing block 310, where the system computes forward error correction codes to include the first XOR check bytes, the second XOR check bytes, and the third XOR check bytes. For instance, in FIG. 1 above, the system 100 generated codes 134, 136, 137, and 138.

The flow 300 continues at processing block 312, where the system generates a transmission packet that includes the data units and the forward error correction codes, where the data units and forward error correction codes are organized in the transmission packet in a way that corresponds to the rows and columns of the matrix.

The flow 300 continues at processing block 314, where the system transmits the transmission packet to a gaming device that uses the gaming data to present gaming content.

Figure 4:
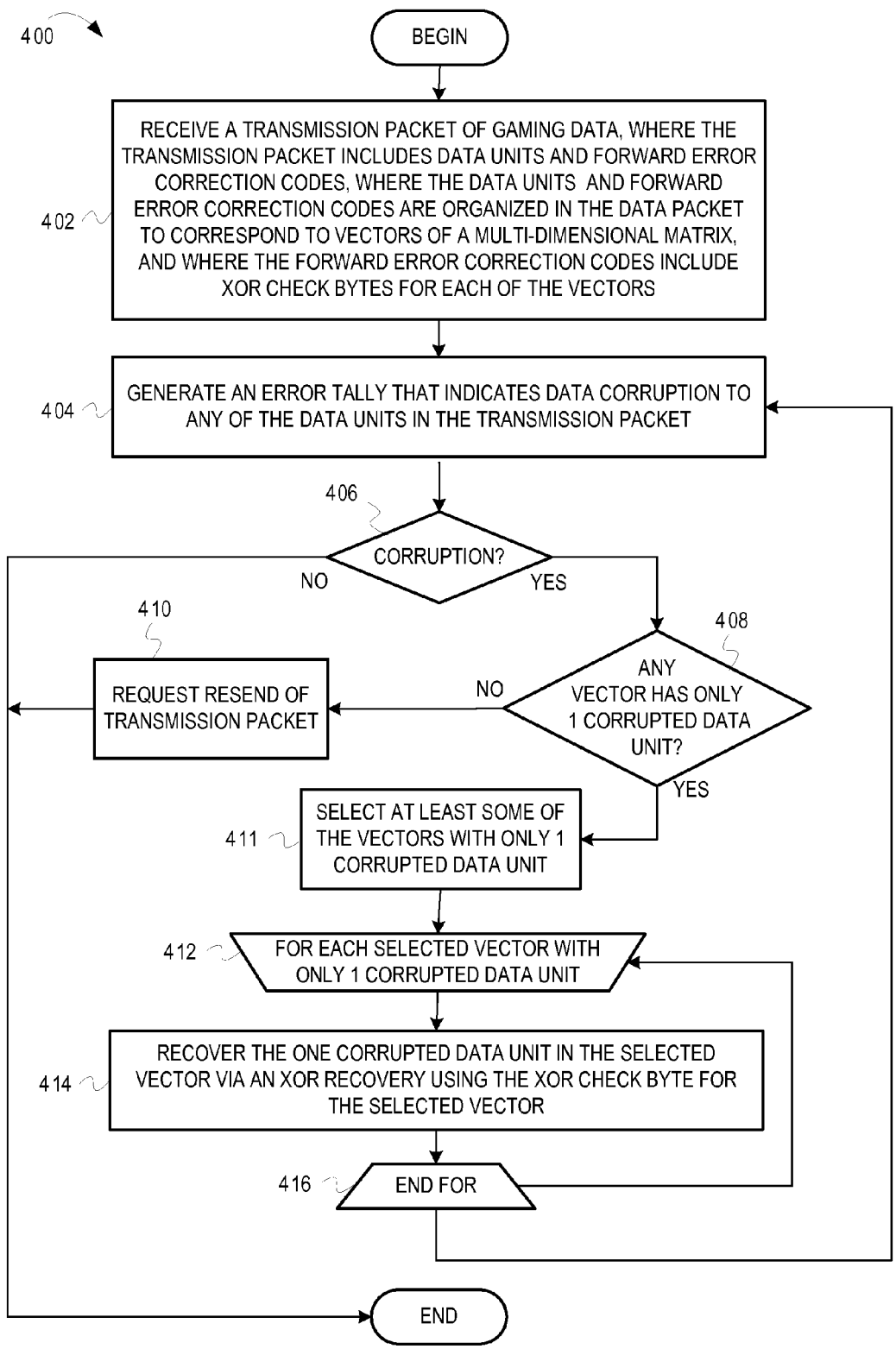
FIG. 4 is a flow diagram 400 illustrating detecting and correcting errors using iterative XOR FEC, according to some embodiments.

FIG. 4 is a flow diagram ("flow") 400 illustrating detecting and correcting errors using iterative XOR forward error correction, according to some embodiments. In FIG. 4, the flow 400 begins at processing block 402, where a wagering game system ("system") receives a transmission packet of gaming data, where the transmission packet includes data units and forward error correction codes, where the data units and forward error correction codes are organized in the data packet to correspond to vectors of a multi-dimensional matrix, and where the forward error correction codes include XOR check bytes for each of the vectors. As described above, the vectors can be organized as rows and columns. For example, as specified in FIG. 3, the forward error correction codes can include first XOR check bytes of the data units in each row, second XOR check bytes of the data units in each column, an XOR check byte of the first XOR check bytes, and an XOR check byte of the second XOR check bytes.

The flow 400 continues at processing block 404, where the system generates an error tally that indicates data corruption to any of the data units in the transmission packet.

The flow continues at decisional processing block 406, wherein the system determines, from the error tally, whether there is corruption in any of the data units. If there is no corruption detected, the flow 400 ends. If, however, the system detects corruption, the flow 400 continues at decisional processing block 408.

At decisional block 408, the system determines whether any of the vectors has only one ("1") corrupted data unit. If there are no vectors (e.g., rows or columns) that have only one corrupted data unit, then the packet may be unrecoverable and, the flow 400 continues at processing block 410 where the system requests a resend of the packet. If, however, at decisional processing block 408, there are any vectors that have only 1 corrupted data unit, the flow 400 continues at processing block 411.

At processing block 411, the system selects at least some of the vectors with only 1 corrupted data unit (e.g., select the columns with only 1 corrupted data unit).

The flow 400 continues at processing block 412, where the system initiates a loop, or some form of iterative or repetitive pattern, that, for the selected vectors with only 1 corrupted data unit (e.g., the selected columns with only 1 corrupted data unit), the system, at processing block 414, recovers the one corrupted data unit via an XOR recovery using the respective XOR check byte that applies to the affected vector.

The flow 400 continues at processing block 416, where the system repeats the looping pattern (412-416) until all of the selected vectors with only 1 corrupted data unit is recovered.

After the system completes the looping pattern 412-416, the flow 400 initiates a larger looping pattern, returning to processing block 404 where the system regenerates the error tally (404) and reevaluates the corruption of the packet (406), then either ends the flow 400 or repeats blocks 408-416. The larger looping pattern can continue until either there is no more corruption (e.g., flow 400 goes from 406 to "End") or the packet is determined to be unrecoverable (e.g., flow 400 goes from 408 to 410). For instance, on a second iteration of the larger looping patter (e.g., the system detects continued corruption (406) and determines that some of the vectors have only 1 corrupted data unit (408)) the system can select a different grouping of the vectors (411) (e.g., the system selects the rows that have only 1 corrupted data unit, whereas on the first iteration the system selected the columns that had only 1 corrupted data unit).

If the system repeats the larger looping pattern until all data units are recovered the packet is usable (e.g., the system detects no corruption at 406) and the system can use the transmission packet, such as to control and/or present gaming content, effects, etc.

Figure 5:
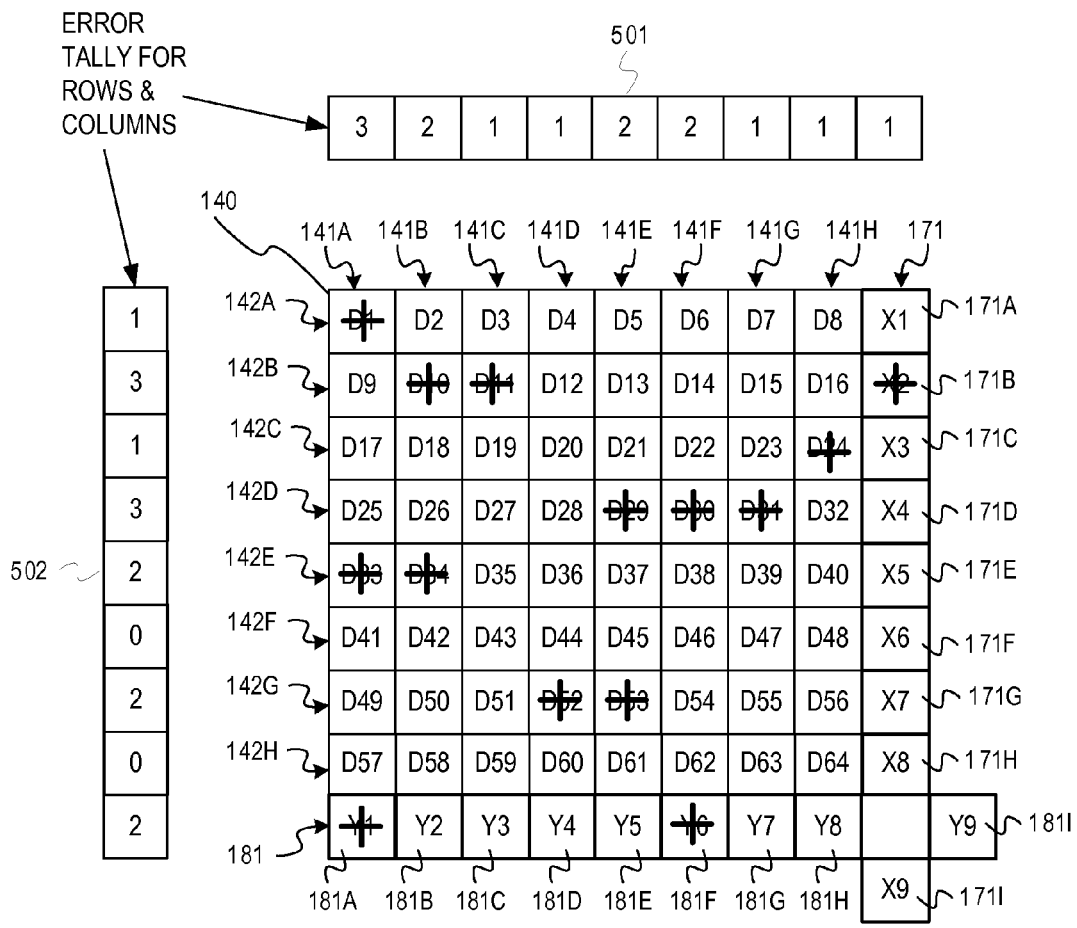
FIGS. 5-10 are illustrations of detecting and correcting errors using iterative XOR recovery using an XOR matrix, according to some embodiments.

FIGS. 5-10 are block diagrams that illustrate the flow 400. The description of FIG. 5 will refer to a wagering game system ("system") that includes a receiving device ("packet receiver"). The system may be the same system referred to in FIG. 4 or FIG. 1. For example, in FIG. 1, the wagering game machine 160 is an example of a packet receiver. In another example, a packet receiver is an emotive lighting controller. In yet another example, the packet receiver is an electronic gaming table, or any other device connected to a casino network that can use gaming data and/or present gaming content. In FIG. 5, the packet receiver receives a packet of data that includes gaming data separated into multiple data units (e.g., data units D1-D64). The data units correspond to matrix entries of the matrix 140 grouped into rows (142A-H) and columns (141A-H). The matrix 140 has an additional column 171 that includes XOR check bytes 171A-H of data units for each of the rows 142A-H. The additional column 171 also includes the first additional check byte 171I. The matrix 140 has an additional row 181 that includes XOR check bytes 181A-H of data units for each of the columns 141A-H. The additional row 181 also includes the second additional check byte 181I.

The packet receiver computes a column error tally 501 of any of the data units or XOR check bytes in any of the matrix entries of the columns 141A-H or the column 171. The packet receiver further computes a row error tally 502 of any of the data units or XOR check bytes in any of the matrix entries of the rows 142A-H or the row 181. The errors are corrupted data (e.g., corrupted data units and corrupted check bytes) and indicated by a plus "+" symbol 511 in FIGS. 5-10. The packet receiver detects any of the rows or columns that have only one error. For example, five columns (i.e., columns 141C, 141D, 141G, 141 H, and 171) each only have one error each. Two of the rows (i.e., rows 142A and 142C) also have only one error each. The system may compare a number of columns in the column tally 501 with only one error and a number of rows in the row tally 502 with only one error. Based on whichever indicates more columns or rows that have only one error, the system may select either the columns or the rows to begin XOR recovery. For example, the packet receiver determines that the column error tally 501 indicates more columns with 1 error (i.e., five columns) versus only two errors indicated by the row error tally 502. The packet receiver may then decide to first recover the data in columns 141C, 141D, 141G, 141 H, and 171 before recovering errors in the rows 142A and 142C. The packet receiver may decide to correct only the columns or the row because correction to columns may also correct errors to rows, or vice versa, as the columns and rows share some corrupted data units.

Figure 6:
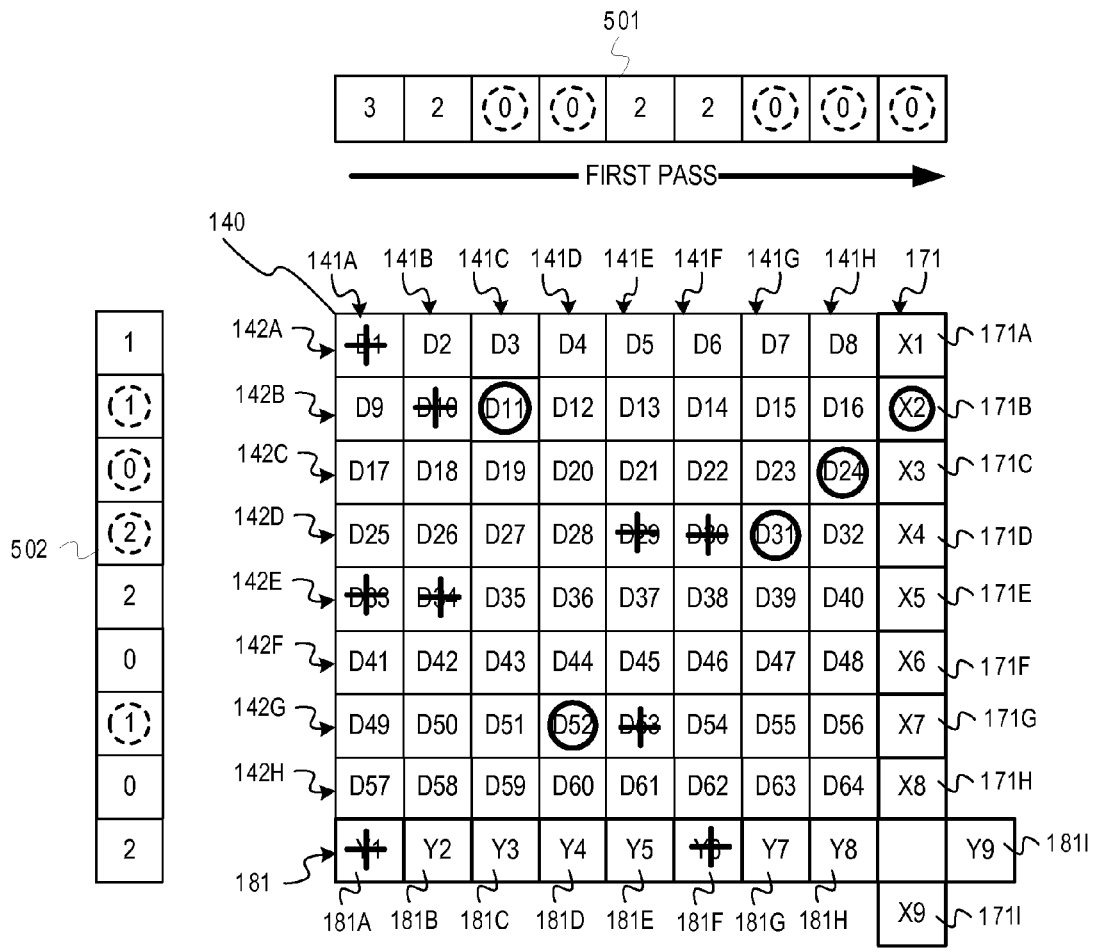

In FIG. 6, the packet receiver recovers the one corrupted data units in the columns 141C, 141D, 141G, 141 H, and 171. The packet receiver, for example, recovers D11 from column 141C by computing an XOR operation of all of the other values in the column 141C except the value of D11. In other words, because of the property of XOR mentioned previously D11 equals the XOR-ed value of D3, D19, D27, D35, D43, D51, D59, and Y3 (e.g., D11=D3^D19^D27^D35^D43^D51^D59^Y3). The recovered portions of the matrix 140 are indicated by solid circle symbols 612.

The packet receiver re-computes the column error tally 501 and the row error tally 502 and updates any tally counts for rows or columns that experienced a reduction to errors. The updated tally counts are indicated in the column error tally 501 and the row error tally 502 by a dashed-circle symbol 613. Based on the updated error tally, rows 142B and 142G now have only 1 error each.

Figure 7:
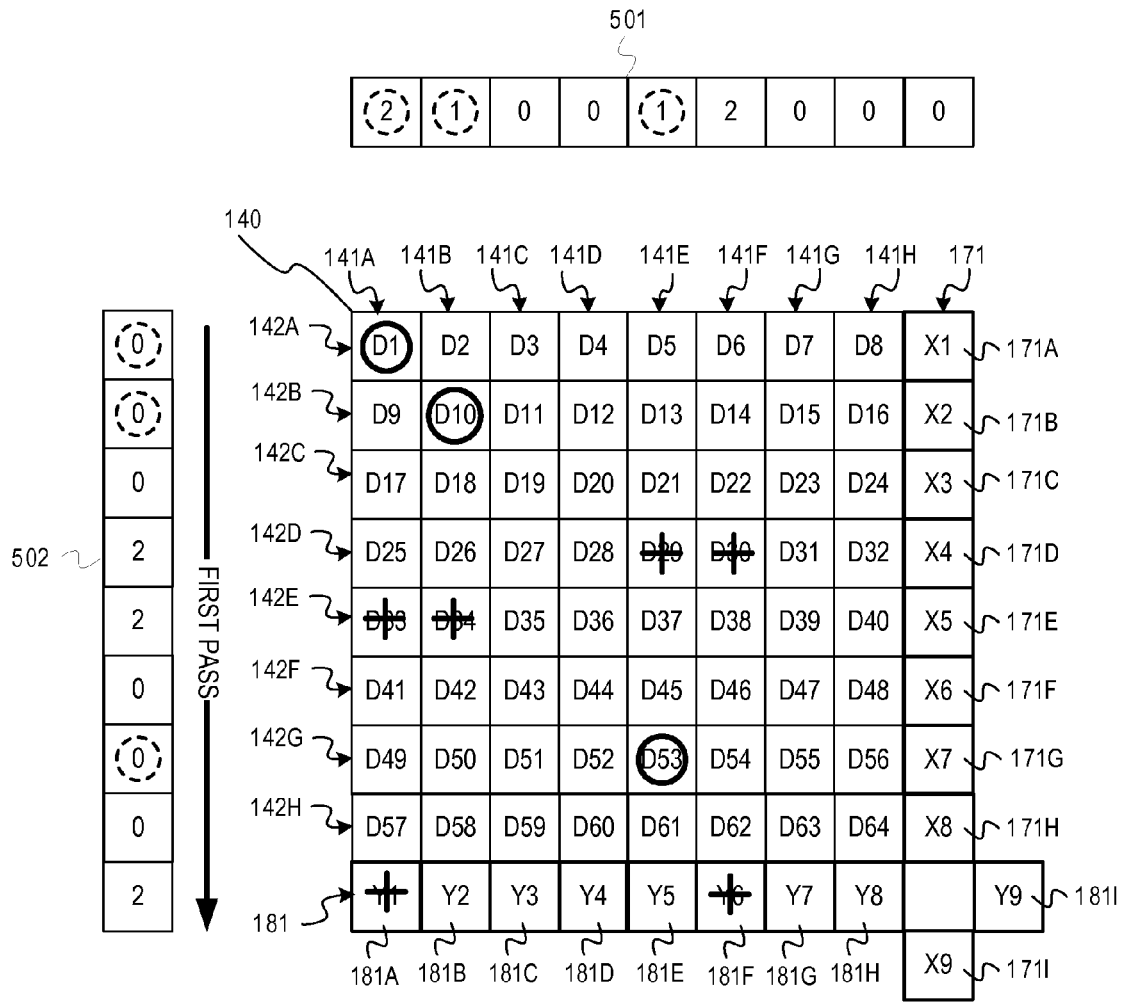

In FIG. 7, the packet receiver then recovers any of the rows with only one error (i.e., recovers the data values D1, D10, and D53) using XOR recovery. The packet receiver then re-computes the row error tally 502 and the column error tally 501 and determines that columns 141B and column 141E now have only one error each.

Figure 8:
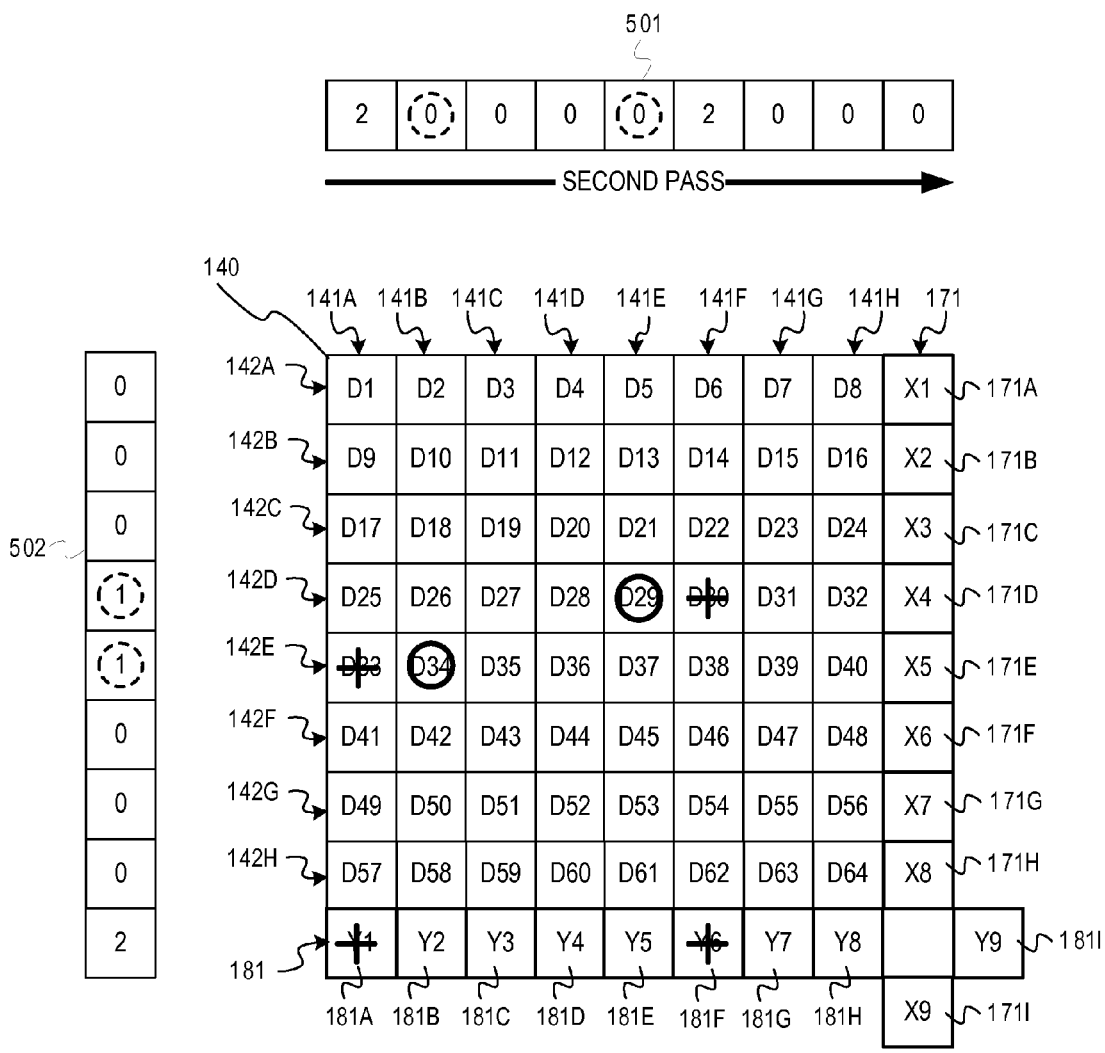

In FIG. 8, the packet receiver then recovers the data for columns 141B and column 141E using XOR recovery and re-computes the column error tally 501 and the row error tally 502. The packet receiver determines that rows 142D and 142E now have only one error each.

Figure 9:
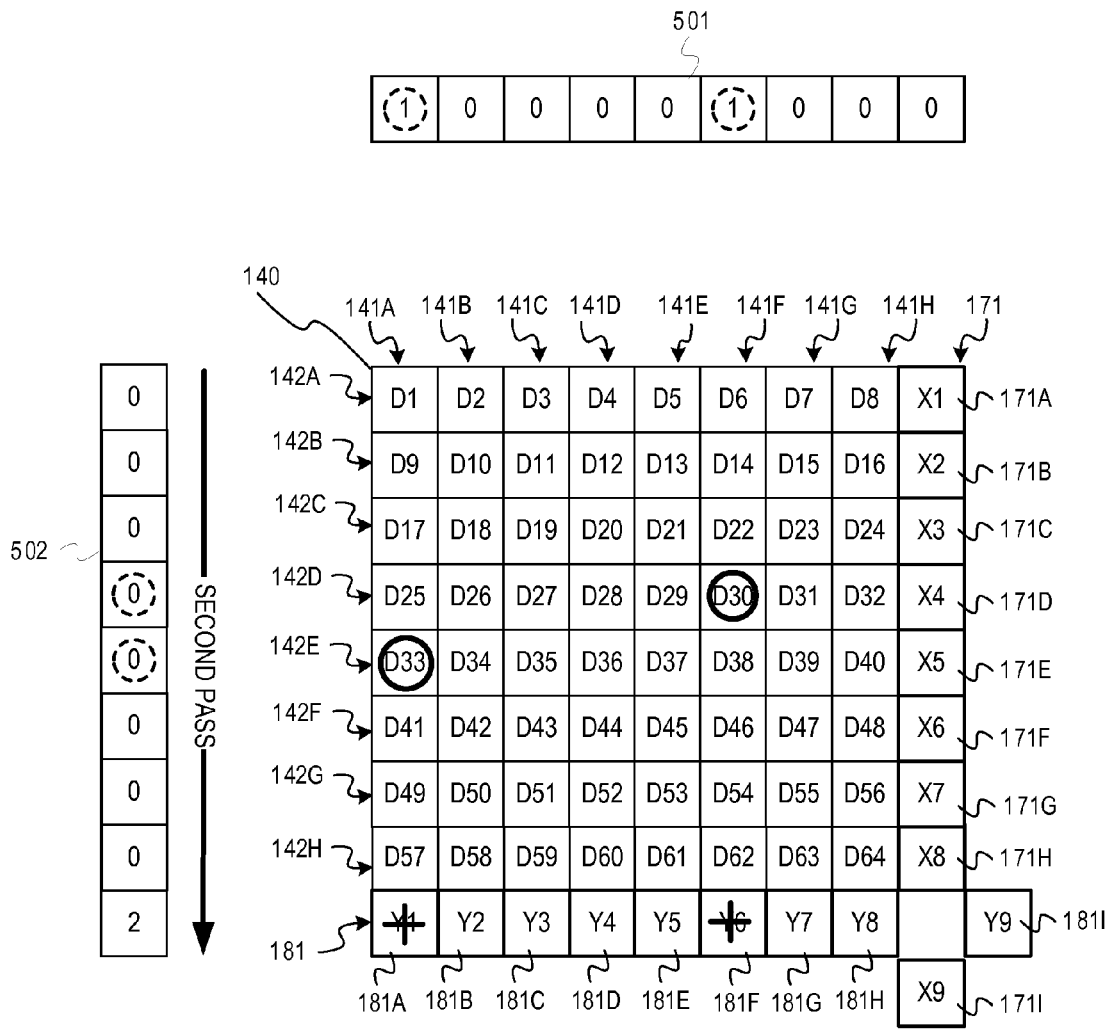

In FIG. 9, the packet receiver then recovers the data for rows 142D and 142E using XOR recovery. The packet receiver re-computes the row error tally 502 and the column error tally 501 and determines that columns 141A and 141F now only have one error each.

Figure 10:
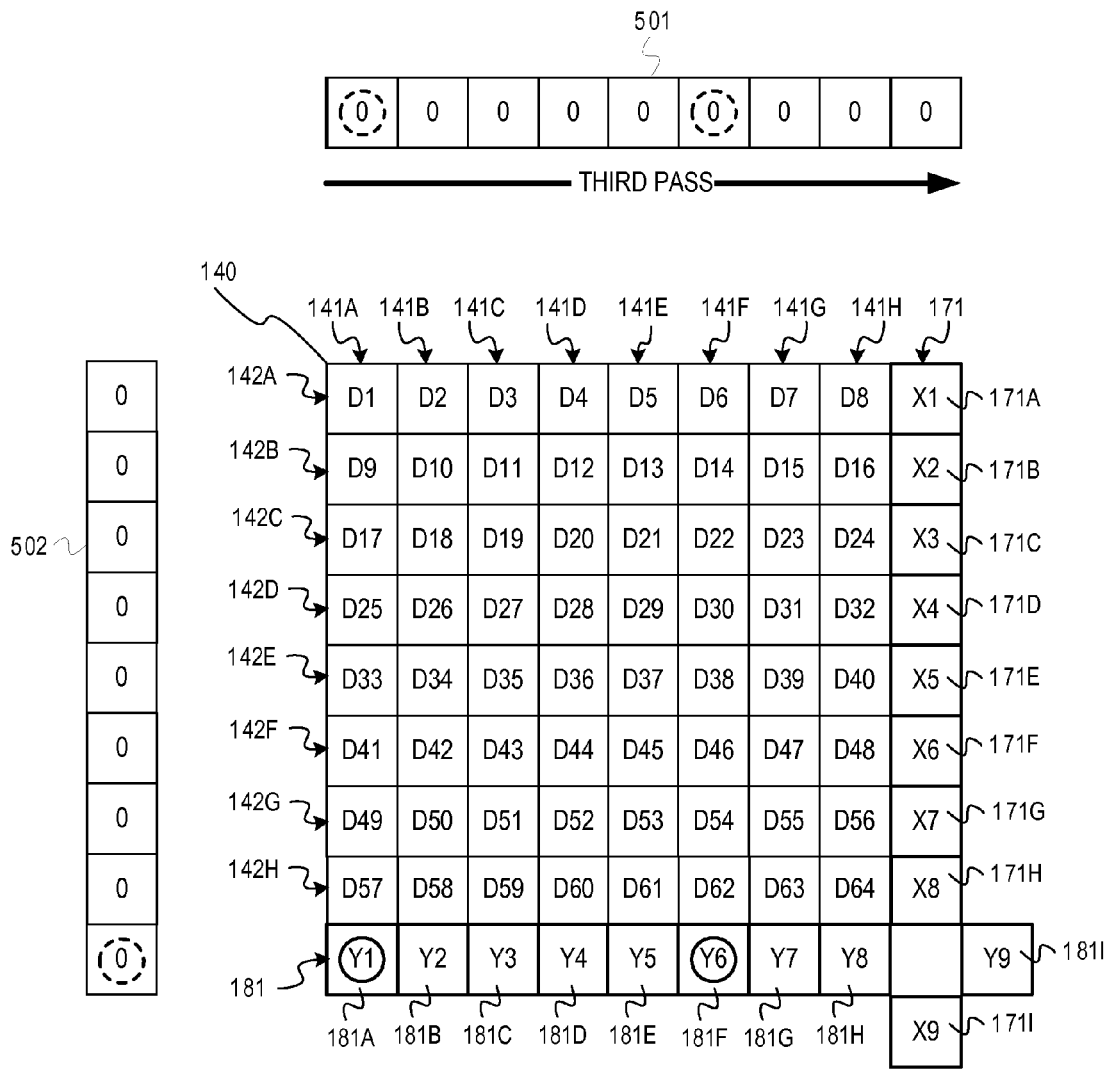

In FIG. 10, the packet receiver recovers the columns 141A and 141F using XOR recovery and re-computes the column error tally 501 and the row error tally 502. The packet receiver determines that all errors have been resolved.

Additional Example Embodiments

According to some embodiments, a wagering game system ("system") can provide various example devices, operations, etc., to perform forward error correction for gaming data. The following non-exhaustive list enumerates some possible embodiments.

In some embodiments, the system modifies a size of an XOR matrix based on network conditions. For example, FIG. 1 illustrated a matrix 140 that has 64 units within rows and columns that have an equivalent number of data units in each row and/or column. However, other embodiments may include a matrix that has rows and columns of unequal sizes (e.g., 16 rows and 4 columns, or 2 rows and 32 columns). In some embodiments, the system can separate the gaming data into a number of units, rows, columns, etc. according to noise on the network or an importance of data being transferred. For instance, if the system includes a lot of noise at any given moment, the system can decrease a size of a row, which will result in a higher number of XOR check bytes, adding more redundant data to a packet, increasing the chances of recovering data. In some embodiments, the system can change the size of the matrix dynamically based on the conditions of the network. At some times, such as at slow times in a casino, or for gaming effects that are not tied to large wins, the system may increase a row size (i.e., decreasing a number of XOR check bytes). At other times, such as at busy times in a casino, or for gaming effects that are tied to large wins (e.g., jackpot values), the system may decrease a row size.

In some embodiments, the system can further increase a number of dimensions of a matrix based on conditions of the network, a size of gaming data to be transmitted, etc. The number of dimensions of the matrix can be associated with one or more additional faces to a polygonal shape of the matrix. For example, a matrix may have a cube shape with four faces of rows and columns, an octagonal polygonal matrix having eight faces of rows and columns, etc. In other words, the matrix can be patterned after a polygonal shape with multiple surfaces (e.g., a cube shape with six surfaces, or faces), where each surface has separate vectors of rows and columns. The matrix thus can have multiple groups of rows and columns that correspond to the separate surfaces of the polygonal shape. The matrix can also include tensors instead of, or in addition to, vectors. The system can generate check bytes for each vector on each face, or surface, of the polygonal shape similarly as described above. For instance, the matrix 140 described above may be one face of a cube, which may include five additional faces, each with separate data units, separate groups or XOR check bytes for the rows and columns of each separate face, and separate additional XOR check bytes of the groups of XOR check bytes.

In some embodiments, the system utilizes Manchester encoding which aids in detecting transmission bit errors in the received data more reliably than using parity-bit encoding.

Additional Example Operating Environments

This section describes example operating environments, systems and networks, and presents structural aspects of some embodiments.

Wagering Game Machine Architecture

Figure 11:
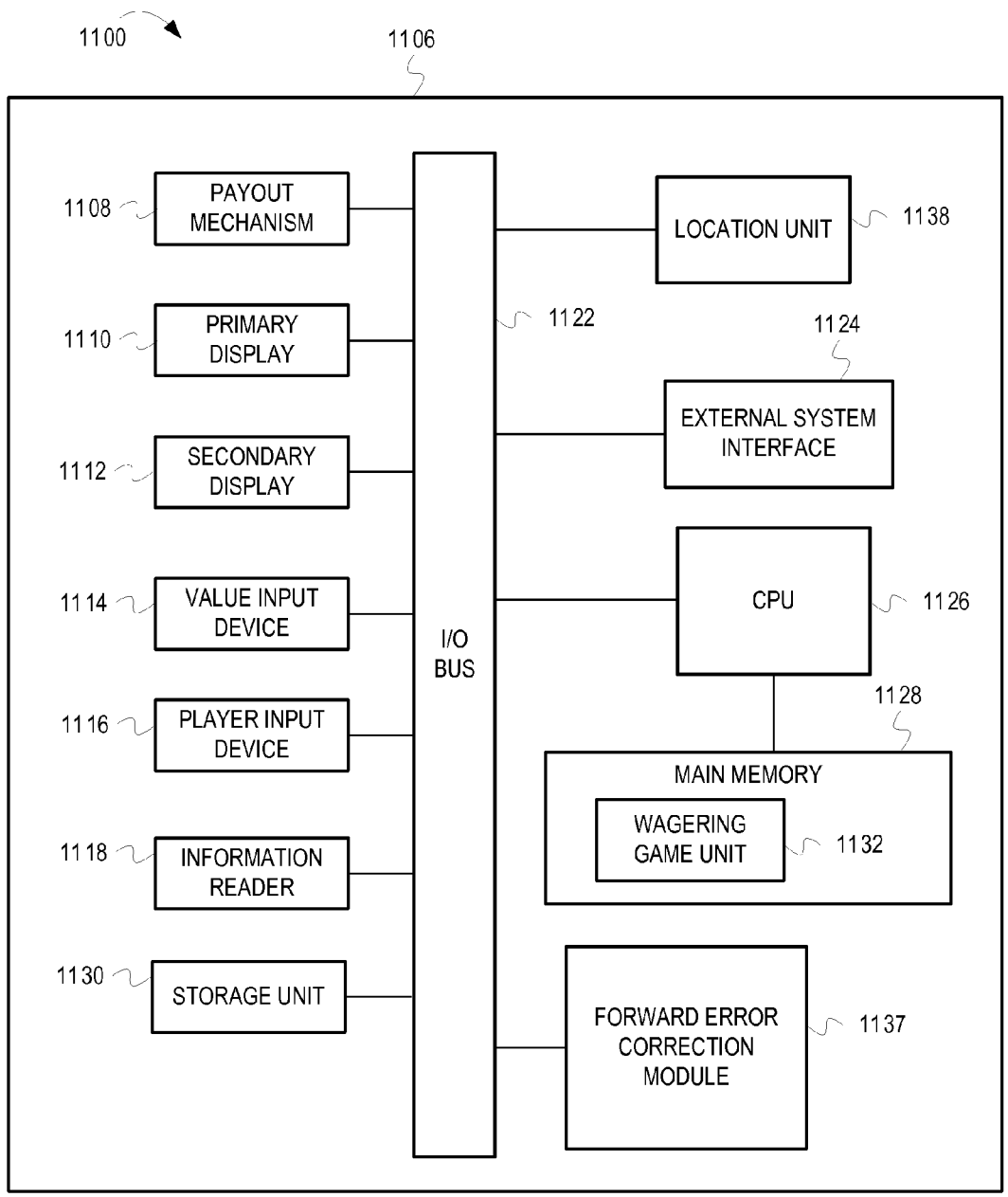
FIG. 11 is an illustration of a wagering game machine architecture 1100, according to some embodiments.

FIG. 11 is a conceptual diagram that illustrates an example of a wagering game machine architecture 1100, according to some embodiments. In FIG. 11, the wagering game machine architecture 1100 includes a wagering game machine 1106, which includes a central processing unit (CPU) 1126 connected to main memory 1128. The CPU 1126 can include any suitable processor, such as an Intel® Pentium processor, Intel® Core 2 Duo processor, AMD Opteron™ processor, or UltraSPARC processor. The main memory 1128 includes a wagering game unit 1132. In some embodiments, the wagering game unit 1132 can present wagering games, such as video poker, video black jack, video slots, video lottery, reel slots, etc., in whole or part.

The CPU 1126 is also connected to an input/output ("I/O") bus 1122, which can include any suitable bus technologies, such as an AGTL+ frontside bus and a PCI backside bus. The I/O bus 1122 is connected to a payout mechanism 1108, primary display 1110, secondary display 1112, value input device 1114, player input device 1116, information reader 1118, and storage unit 1130. The player input device 1116 can include the value input device 1114 to the extent the player input device 1116 is used to place wagers. The I/O bus 1122 is also connected to an external system interface 1124, which is connected to external systems (e.g., wagering game networks). The external system interface 1124 can include logic for exchanging information over wired and wireless networks (e.g., 802.11g transceiver, Bluetooth transceiver, Ethernet transceiver, etc.)

The I/O bus 1122 is also connected to a location unit 1138. The location unit 1138 can create player information that indicates the wagering game machine's location/movements in a casino. In some embodiments, the location unit 1138 includes a global positioning system (GPS) receiver that can determine the wagering game machine's location using GPS satellites. In other embodiments, the location unit 1138 can include a radio frequency identification (RFID) tag that can determine the wagering game machine's location using RFID readers positioned throughout a casino. Some embodiments can use GPS receiver and RFID tags in combination, while other embodiments can use other suitable methods for determining the wagering game machine's location. Although not shown in FIG. 11, in some embodiments, the location unit 1138 is not connected to the I/O bus 1122.

In some embodiments, the wagering game machine 1106 can include additional peripheral devices and/or more than one of each component shown in FIG. 11. For example, in some embodiments, the wagering game machine 1106 can include multiple external system interfaces 1124 and/or multiple CPUs 1126. In some embodiments, any of the components can be integrated or subdivided.

In some embodiments, the wagering game machine 1106 includes a forward error correction module 1137. The forward error correction module 1137 can process communications, commands, or other information, where the processing can perform forward error correction for gaming data.

Furthermore, any component of the wagering game machine 1106 can include hardware, firmware, and/or machine-readable storage media including instructions for performing the operations described herein.

Wagering Game Machine

Figure 12:
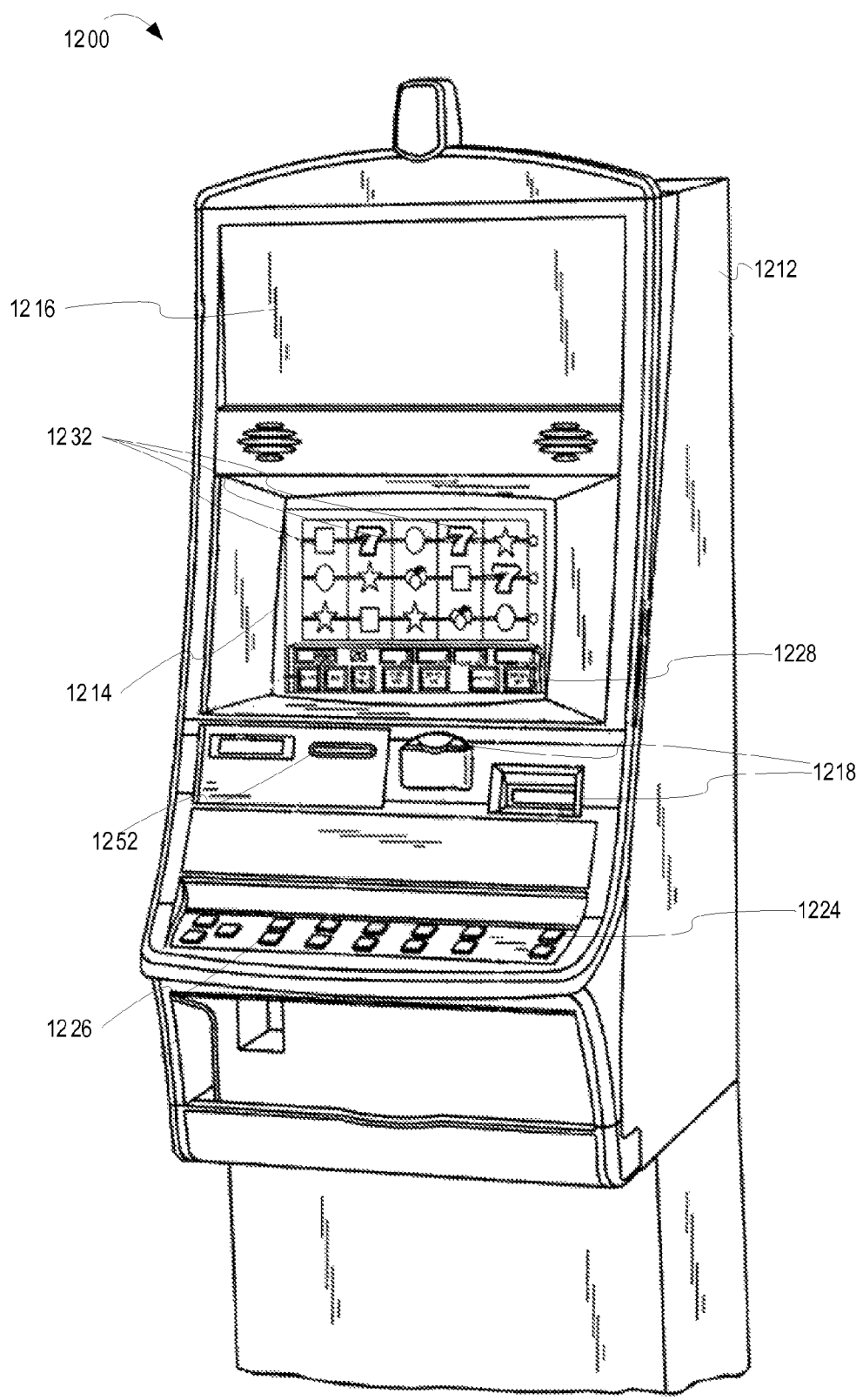
FIG. 12 is an illustration of a wagering game machine 1200, according to some embodiments.

FIG. 12 is a conceptual diagram that illustrates an example of a wagering game machine 1200, according to some embodiments. Referring to FIG. 12, the wagering game machine 1200 can be used in gaming establishments, such as casinos. According to some embodiments, the wagering game machine 1200 can be any type of wagering game machine and can have varying structures and methods of operation. For example, the wagering game machine 1200 can be an electromechanical wagering game machine configured to play mechanical slots, or it can be an electronic wagering game machine configured to play video casino games, such as blackjack, slots, keno, poker, blackjack, roulette, etc.

The wagering game machine 1200 comprises a housing 1212 and includes input devices, including value input devices 1218 and a player input device 1224. For output, the wagering game machine 1200 includes a primary display 1214 for displaying information about a basic wagering game. The primary display 1214 can also display information about a bonus wagering game and a progressive wagering game. The wagering game machine 1200 also includes a secondary display 1216 for displaying wagering game events, wagering game outcomes, and/or signage information. While some components of the wagering game machine 1200 are described herein, numerous other elements can exist and can be used in any number or combination to create varying forms of the wagering game machine 1200.

The value input devices 1218 can take any suitable form and can be located on the front of the housing 1212. The value input devices 1218 can receive currency and/or credits inserted by a player. The value input devices 1218 can include coin acceptors for receiving coin currency and bill acceptors for receiving paper currency. Furthermore, the value input devices 1218 can include ticket readers or barcode scanners for reading information stored on vouchers, cards, or other tangible portable storage devices. The vouchers or cards can authorize access to central accounts, which can transfer money to the wagering game machine 1200.

The player input device 1224 comprises a plurality of push buttons on a button panel 1226 for operating the wagering game machine 1200. In addition, or alternatively, the player input device 1224 can comprise a touch screen 1228 mounted over the primary display 1214 and/or secondary display 1216.

The various components of the wagering game machine 1200 can be connected directly to, or contained within, the housing 1212. Alternatively, some of the wagering game machine's components can be located outside of the housing 1212, while being communicatively coupled with the wagering game machine 1200 using any suitable wired or wireless communication technology.

The operation of the basic wagering game can be displayed to the player on the primary display 1214. The primary display 1214 can also display a bonus game associated with the basic wagering game. The primary display 1214 can include a cathode ray tube (CRT), a high resolution liquid crystal display (LCD), a plasma display, light emitting diodes (LEDs), or any other type of display suitable for use in the wagering game machine 1200. Alternatively, the primary display 1214 can include a number of mechanical reels to display the outcome. In FIG. 12, the wagering game machine 1200 is an "upright" version in which the primary display 1214 is oriented vertically relative to the player. Alternatively, the wagering game machine can be a "slant-top" version in which the primary display 1214 is slanted at about a thirty-degree angle toward the player of the wagering game machine 1200. In yet another embodiment, the wagering game machine 1200 can exhibit any suitable form factor, such as a free standing model, bar top model, mobile handheld model, or workstation console model.

A player begins playing a basic wagering game by making a wager via the value input device 1218. The player can initiate play by using the player input device's buttons or touch screen 1228. The basic game can include arranging a plurality of symbols 1232 along a pay line, which indicates one or more outcomes of the basic game. Such outcomes can be randomly selected in response to player input. At least one of the outcomes, which can include any variation or combination of symbols, can trigger a bonus game.

In some embodiments, the wagering game machine 1200 can also include an information reader 1252, which can include a card reader, ticket reader, bar code scanner, RFID transceiver, or computer readable storage medium interface. In some embodiments, the information reader 1252 can be used to award complimentary services, restore game assets, track player habits, etc.

Embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments of the inventive subject matter may take the form of a computer program product embodied in any tangible medium of expression having computer readable program code embodied in the medium. The described embodiments may be provided as a computer program product, or software, that may include a machine-readable storage medium having stored thereon instructions, which may be used to program a computer system (or other electronic device(s)) to perform a process according to embodiments(s), whether presently described or not, because every conceivable variation is not enumerated herein. A machine-readable storage medium includes any mechanism that stores information in a form readable by a machine (e.g., a wagering game machine, computer, etc.). For example, machine-readable storage media includes read only memory (ROM), random access memory (RAM), magnetic disk storage media, optical storage media (e.g., CD-ROM), flash memory machines, erasable programmable memory (e.g., EPROM and EEPROM); etc. Some embodiments of the invention can also include machine-readable signal media, such as any media suitable for transmitting software over a network.

General

This detailed description refers to specific examples in the drawings and illustrations. These examples are described in sufficient detail to enable those skilled in the art to practice the inventive subject matter. These examples also serve to illustrate how the inventive subject matter can be applied to various purposes or embodiments. Other embodiments are included within the inventive subject matter, as logical, mechanical, electrical, and other changes can be made to the example embodiments described herein. Features of various embodiments described herein, however essential to the example embodiments in which they are incorporated, do not limit the inventive subject matter as a whole, and any reference to the invention, its elements, operation, and application are not limiting as a whole, but serve only to define these example embodiments. This detailed description does not, therefore, limit embodiments, which are defined only by the appended claims. Each of the embodiments described herein are contemplated as falling within the inventive subject matter, which is set forth in the following claims.

The invention claimed is:

1. A computer-implemented method comprising:
   receiving a packet of gaming data, wherein the packet includes data units and exclusive-OR check bytes, wherein the data units and exclusive-OR check bytes are organized in the packet to correspond to vectors of a matrix, wherein a size of the matrix corresponds to a level of importance of the gaming data, wherein each of the exclusive-OR check bytes represent a result of a logical exclusive disjunction operation on a portion of the data units contained in each of the vectors;
   detecting that some of the data units have data corruption;
   selecting, via one or more processors, one of the exclusive-OR check bytes that corresponds to one of the vectors, wherein the one of the vectors includes only one corrupted data unit; and
   recovering, via at least one of the one or more processors, the one corrupted data unit using the one of the exclusive-OR check bytes that corresponds to the one of the vectors.

2. The computer-implemented method of claim 1, wherein the one of the vectors includes non-corrupted data units, and wherein recovering the one corrupted data unit comprises:
   performing an additional logical exclusive disjunction operation on the one of the exclusive-OR check bytes and the non-corrupted data units; and
   using a result of the additional logical exclusive disjunction operation as a recovered data unit, wherein the recovered data unit is equivalent to a value of the one corrupted data unit before the one corrupted data unit became corrupted.

3. The computer-implemented method of claim 1, wherein the vectors comprise rows and columns of the matrix, and wherein the exclusive-OR check bytes comprise a first group of the exclusive-OR check bytes that corresponds to the rows, a second group of the exclusive-OR check bytes that correspond to the columns, a first additional one of the exclusive-OR check bytes that corresponds to the first group of the exclusive-OR check bytes, and a second additional one of the exclusive-OR check bytes that corresponds to the second group of the exclusive-OR check bytes.

4. The computer-implemented method of claim 1, wherein the packet includes additional data that identifies a structure of the vectors within the matrix, and further comprising:
   using the additional data to organize the data units into the vectors of the matrix; and
   using the additional data to associate the exclusive-OR check bytes with the vectors.

5. The computer-implemented method of claim 1, wherein the detecting that some of the data units have data corruption comprises:
   generating error tallies for the each of the vectors, wherein each of the error tallies indicate a number of the data units that are corrupted for the each of the vectors; and
   determining that the number of the data units that are corrupted for the one of the vectors is equal to a value of one, and wherein said selecting the one of the exclusive-OR check bytes that corresponds to the one of the vectors is in response to determining that the number of the data units that are corrupted for the one of the vectors is equal to the value of one.

6. The computer-implemented method of claim 1 wherein the exclusive-OR check bytes are included in forward error correction codes.

7. The computer-implemented method of claim 1, wherein the matrix is a three-dimensional matrix having a polygonal shape, wherein the vectors are divided into multiple groups, wherein each of the groups corresponds to a separate surface of the polygonal shape, and wherein the matrix is a three-dimensional matrix instead of a two dimensional matrix based on the level of importance of the gaming data being above a threshold level.

8. One or more non-transitory, machine-readable storage media having instructions stored thereon, which when executed by a set of one or more processors causes the set of one or more processors to perform operations comprising:
   prior to transmission of gaming data via a casino communications network, determining a level of importance of the gaming data;
   determining a number of data units to divide the gaming data into based on the level of importance of the gaming data;
   dividing the gaming data into the number of data units;
   organizing the data units into groupings of the data units that correspond to vectors in a matrix;
   computing exclusive-OR check bytes of the groupings of the data units, wherein each one of the exclusive-OR check bytes corresponds to each one of the groupings of the data units;
   generating error correction codes for each of the exclusive-OR check bytes;
   organizing the groupings of the data units into a packet;
   associating the error correction codes with the groupings of the data units within the packet; and
   transmitting the packet via the casino communications network.

9. The one or more machine-readable storage media of claim 8, wherein the operation for determining the level of importance of the gaming data includes one or more operations comprising determining one or more of a degree of wagering activity related to the gaming data, and a degree of required synchronization of presentation of the gaming data.

10. The one or more machine-readable storage media of claim 8, wherein the vectors are rows and columns of the matrix, and wherein the operations for computing the exclusive-OR check bytes of the groupings of the data units includes operations further comprising:
   generating a first group of the exclusive-OR check bytes associated with the rows;
   computing a first of the exclusive-OR check bytes via a first logical exclusive disjunction operation on the first group of the exclusive-OR check bytes;
   generating a second group of the exclusive-OR check bytes associated with the columns; and
   computing a second of the exclusive-OR check bytes via a second logical exclusive disjunction operation on the first group of the exclusive-OR check bytes.

11. The one or more machine-readable storage media of claim 8, wherein the operation for computing the exclusive-OR check bytes of the groupings of the data units includes operations further comprising:
   organizing the data units into the vectors of the matrix; and
   for every one of the vectors, performing a logical exclusive disjunction operation on all values of the data units that are organized into the one of the vectors, wherein said performing the logical exclusive disjunction operation generates one of the exclusive-OR check bytes associated with the one of the vectors.

12. The one or more machine-readable storage media of claim 8, the operations further comprising including in the packet information one or more of a value of a number of dimensions of the matrix and a value of a number of the vectors, wherein, upon reception of the packet, the one or more of the value of the number of dimensions of the matrix and the value of the number of vectors are usable to reconstruct the matrix and reorganize the data units and error correction codes into the matrix for performance of at least one logical exclusive disjunction operation on at least one of the data units that is corrupted using at least one of the error correction codes that corresponds to at least one of the vectors into which the at least one of the data units is reorganized.

13. A system comprising:
   one or more processors; and
   at least one memory unit configured to store instructions which, when executed by at least one of the one or more processors, cause the system to determine a level of importance of a gaming effect to be presented by a wagering game client device,
   separate gaming-effects data for the gaming effect into a number of data units based on the level of importance of the gaming effect,
   organize the data units into a packet, wherein the packet is organized according to a matrix, wherein the data units correspond to entries in the matrix, and wherein the entries are organized in the matrix in vectors,
   generate exclusive-OR check bytes, wherein each one of the exclusive-OR check bytes corresponds to each one of the vectors,
   encode the exclusive-OR check bytes into error correction codes,
   organize the error correction codes into the packet according to the matrix, and
   send the packet to the wagering game client device via a communications network.

14. The system of claim 13, wherein the at least one memory unit is configured to store instructions which, when executed by at least one of the one or more processors, further cause the system to include in the packet one or more of a value of a number of dimensions of the matrix and a value of a number of the vectors of the matrix, and wherein the client is configured to use the one or more of the value of the number of dimensions and the value of the number of vectors to reconstruct the matrix and organize the data units into the matrix.

15. The system of claim 13 further comprising the wagering game client device, wherein the wagering game client device is configured to generate a gaming event that triggers a request to receive the gaming-effects data, and wherein the wagering game client device is further configured to present a synchronized light show associated with the gaming-effects data.

16. The system of claim 13, further comprising the wagering game client device, wherein the wagering game client device is configured to receive the packet, reorganize the data units into the matrix, detect corruption of some of the data units, decode the error correction codes according to the matrix, and iteratively correct the some of the data units using the exclusive-OR check bytes, and wherein the wagering game client device is configured to iteratively correct the some of the data units using the exclusive-OR check bytes being configured to generate error tallies for each of the vectors,
determine, from the error tallies, that a portion of the vectors have only one corrupted data unit each, wherein a first subset of the portion of the vectors is associated with a first dimension of the matrix and a second subset of the portion of the vectors is associated with a second dimension of the matrix,
determine that the first subset of the portion of the vectors is greater than the second subset of the portion of the vectors,
select the first subset of the portion of the vectors in response to determining that the first subset of the portion of the vectors is greater than the second subset of the portion of the vectors, and
for each of the first subset of the portion of the vectors, perform a logical exclusive disjunction operation of non-corrupted data units and a corresponding one of the exclusive-OR check bytes.

17. The system of claim 16, wherein the wagering game client device is configured to iteratively correct the some of the data units using the exclusive-OR check bytes being further configured to
regenerate the error tallies for each of the vectors,
determine, from the error tallies, that an additional portion of the vectors have only one corrupted data unit each, wherein a third subset of the additional portion of the vectors that have only one corrupted data unit each is associated with the second dimension of the matrix,
for each of the third subset of the additional portion of the vectors, perform a logical exclusive disjunction operation of additional non-corrupted data units and a corresponding additional one of the exclusive-OR check bytes.

18. An apparatus comprising:
a processor; and
a forward error correction module configured to, via the processor,
receive a packet of gaming data, wherein the packet includes data units and forward error correction codes, wherein the data units and forward error correction codes are organized in the packet to correspond to vectors of a matrix, wherein a number of the vectors of the matrix corresponds to a level of importance of the gaming data, and wherein the forward error correction codes include exclusive-OR check bytes for each of the vectors,
detect that some of the data units have data corruption,
select a group of the vectors that have only one corrupted data unit per vector, and
recover at least a portion of the some of the data units for the group of the vectors using ones of the exclusive-OR check bytes that correspond to each one of the group of the vectors.

19. The apparatus of claim 18, wherein the forward error correction module is further configured to
generate error tallies of each of the vectors, wherein the vectors are separated into a first group of the vectors and a second group of the vectors, wherein the first group of the vectors are oriented parallel to each other in the matrix, and wherein the second group of the vectors are oriented orthogonally to the first group of the vectors,
determine that the error tallies indicate that a first number of the first group of the vectors and a second number of the second group of the vectors have one corrupted data unit each,
determine that the first number of the first group of the vectors is greater than the second number of the second group of the vectors, and
in response to determining that the first number of the first group of the vectors is greater than the second number of the second group of the vectors, for each one of the first number of the first group of the vectors, perform a logical exclusive disjunction operation of non-corrupted data units in the each one of the first number of the first group of the vectors and one of the exclusive-OR check bytes that corresponds to the each one of the first number of the first group of the vectors.

20. The apparatus of claim 19, wherein the forward error correction module is further configured to
generate second error tallies of the each of the vectors,
determine, from the second error tallies, that at least some of the second number of the second group of the vectors have one corrupted data unit each, and
for each one of the at least some of the second number of the second group of the vectors, perform an additional logical exclusive disjunction operation of additional non-corrupted data units in the each one of the at least some of the second number of the second group of the vectors and an additional one of the exclusive-OR check bytes that corresponds to the each one of the at least some of the second number of the second group of the vectors.

21. The apparatus of claim 19, wherein the forward error correction module is further configured to
generate second error tallies of the each of the vectors,
determine, from the second error tallies, that there a no more errors in the packet, and
use the packet to synchronize presentation of the gaming data across a plurality of presentation devices connected to a casino communications network.

22. An apparatus comprising:
means for generating gaming data in response to occurrence of a wagering game event associated with a wagering game device, wherein the gaming data is to be transmitted via a communications network to the wagering game device;
means for determining a level of importance of the wagering game event;
means for determining a number of columns and rows to generate for a matrix according to the level of importance of the wagering game event;
means for dividing the gaming data into data units based on the number of columns and rows;
means for organizing the data units into data unit groupings representative of the number of columns and rows;
means for computing exclusive-OR check bytes that correspond to the columns and rows, wherein each one of the exclusive-OR check bytes corresponds to each one of the rows and columns;
means for generating error correction codes for each of the exclusive-OR check bytes;
means for organizing the data units into a packet according to the rows and columns;
means for associating the error correction codes with the rows and columns within the packet; and
means for providing the packet for transmisson via the casino communications network.

23. The apparatus of claim 22 wherein the means for determining the level of importance of the wagering game event comprises means for determining one or more of a degree of wagering activity associated with the wagering game event, and a degree of required synchronization of presentation of the gaming data via the wagering game device based on the occurrence of the wagering game event.

24. The apparatus of claim 22, wherein the means for computing the exclusive-OR check bytes that correspond to the columns and rows comprises:
 means for generating a first group of the exclusive-OR check bytes for each one of the rows; and
 means for generating a second group of the exclusive-OR check bytes for each one of the columns, and wherein the means for associating the error correction codes with the rows and columns within the packet comprises associating the error correction codes with the first group of the exclusive-OR check bytes and the second group of the exclusive-OR check bytes.

25. The computer-implemented method of claim 1, wherein the level of importance of the gaming data is based on one or more of a degree of wagering activity related to the gaming data, a wagering game win amount associated with the gaming data, and a degree of required synchronization of presentation of the gaming data.

26. The computer-implemented method of claim 1, wherein a number of one or more of vectors and tensors of the matrix corresponds to the level of importance of the gaming data.

27. The computer-implemented method of claim 1 further comprising:
 detecting a wagering game event;
 detecting a level of importance of the wagering game event; and
 determining the level of importance of the gaming data based on the level of importance of the wagering game event.

28. The one or more machine-readable storage media of claim 8, wherein the operation for determining the level of importance of the gaming data includes operations comprising:
 detecting a wagering game event;
 detecting a win value for the wagering game event; and
 calculating the level of importance of the gaming data based on the win value.

29. The one or more machine-readable storage media of claim 8, said operations further comprising:
 determining, based on the level of importance of the gaming data, a number of dimensions for the matrix; and
 generating the matrix according to the number of dimensions.

30. The one or more machine-readable storage media of claim 29, wherein the number of dimensions corresponds to a number of faces of a polygonal shape for the matrix, wherein each of the faces includes at least one row and at least one column.

31. The system of claim 13, wherein the instruction configured to cause the system to determine the level of importance of the gaming effect to be presented by the wagering game client device comprises instructions which, when executed by at least one of the one or more processors, cause the system to
 detect a wagering game event,
 detect a win value for the wagering game event, and
 calculate the level of importance of the gaming effect based on the win value.

32. The system of claim 13 wherein the at least one memory unit is configured to store instructions which, when executed by at least one of the one or more processors, further cause the system to
 determine, based on the level of importance of the gaming data, a number of dimensions for the matrix, and
 generate the matrix according to the number of dimensions.

33. The system of claim 32, wherein the number of dimensions corresponds to a number of faces of a polygonal shape for the matrix, wherein each of the faces includes at least one row and at least one column, and wherein the number of faces is greater than one.

34. The apparatus of claim 18, wherein the gaming data is organized into a matrix with a number of dimensions based on the level of importance of the gaming data, wherein the number of dimensions are greater than two, and wherein the dimensions correspond to a number of faces of a polygonal shape for the matrix.

35. The apparatus of claim 18, wherein the level of importance of the gaming data is based on one or more of a degree of wagering activity related to the gaming data, a wagering game win amount associated with the gaming data, and a degree of required synchronization of presentation of the gaming data.

36. The apparatus of claim 22 further comprising:
 means for computing, based on the level of importance of the wagering game event, a number of faces of a polygonal shape for the matrix, wherein the number of faces is greater than one, and
 means for determining a subset of the number of rows and columns for each face of the polygonal shape of the matrix according to the level of importance of the wagering game event.

37. The apparatus of claim 22, wherein the means for determining the level of importance of the wagering game event comprises means for detecting a wagering game win amount associated with the wagering game event and wherein the means for determining the number of columns and rows to generate for the matrix comprises means for computing the number of columns and rows based on the win amount.

* * * * *